United States Patent [19]
Nojima

[11] Patent Number: 6,058,257
[45] Date of Patent: May 2, 2000

[54] INTEGRATED CIRCUIT, DESIGN METHOD FOR THE SAME, AND MEMORY STORING THE PROGRAM FOR EXECUTING THE DESIGN METHOD

[75] Inventor: Reiko Nojima, Tokyo, Japan

[73] Assignee: Kabushiki Kaisha Toshiba, Kawasaki, Japan

[21] Appl. No.: 09/053,045

[22] Filed: Apr. 1, 1998

[30] Foreign Application Priority Data

Apr. 7, 1997 [JP] Japan .................................. P9-088363

[51] Int. Cl.$^7$ .................................................. H01L 21/70
[52] U.S. Cl. ............................................................ 395/500.13
[58] Field of Search ........................ 395/500.02, 500.06; 257/393

[56] References Cited

U.S. PATENT DOCUMENTS 5,404,310  4/1995  Mitsuhashi ......................... 395/500.06
5,618,744  4/1997  Suzuki ................................ 395/500.02

*Primary Examiner*—Paul R. Lintz
*Assistant Examiner*—Thuan Do
*Attorney, Agent, or Firm*—Foley & Lardner

[57] ABSTRACT

In a semiconductor integrated circuit comprising: a logic circuit which performs prescribed logical operations; first power supply lines (fundamental power lines) which supply source power to the logic circuit; and second power supply lines which are provided, on the logic circuit, in a wiring level different from that for the first power supply lines and also which are interconnected with the first power supply lines through contact holes at the intersections therebetween, the number and the positions of the contact holes can be determined so as to minimize the voltage drop value at the logic circuit. As a result, the voltage drop can be relaxed, thus assuring stable operations of the circuit.

19 Claims, 24 Drawing Sheets

POSITIONS OF CONTACT HOLES

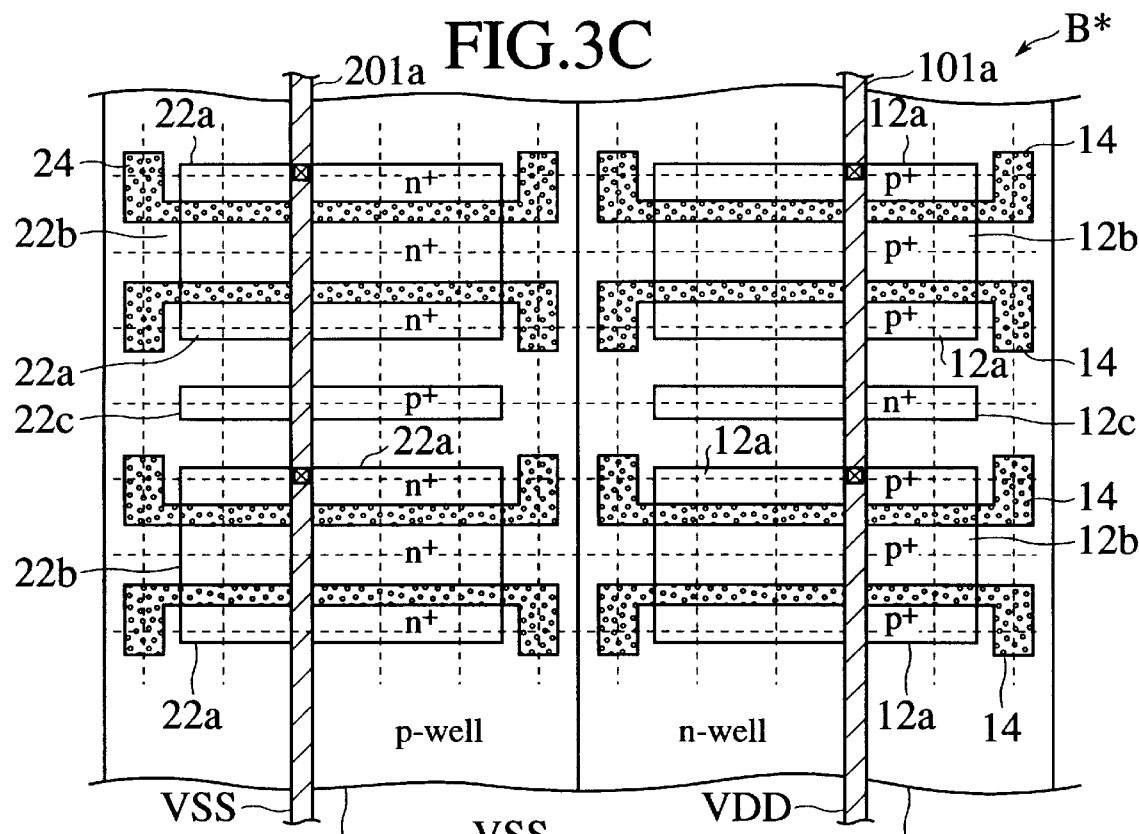
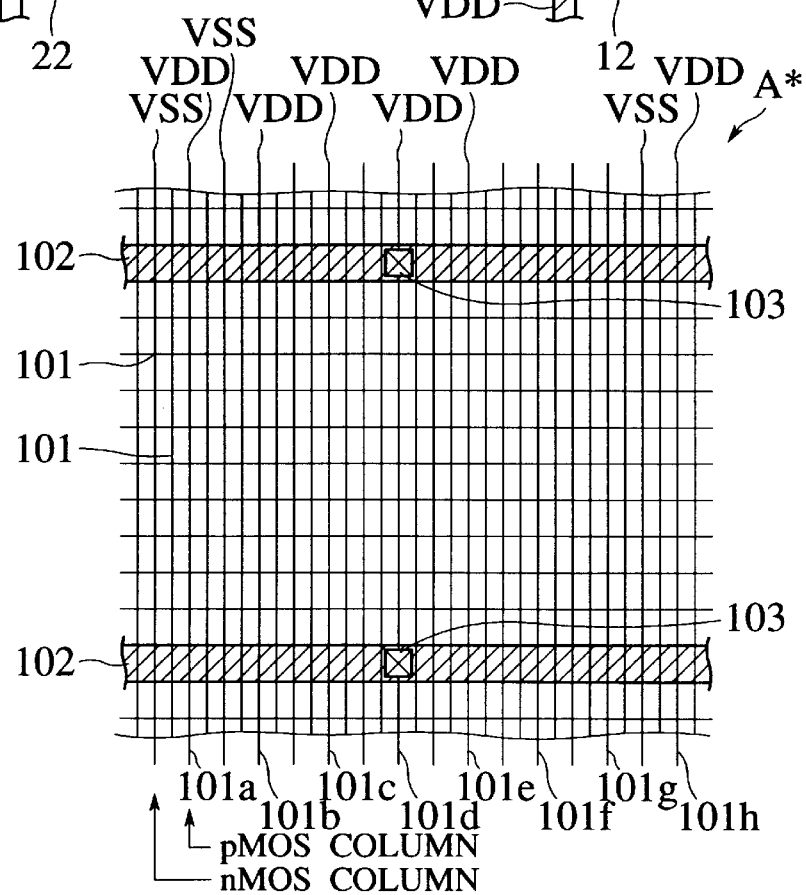

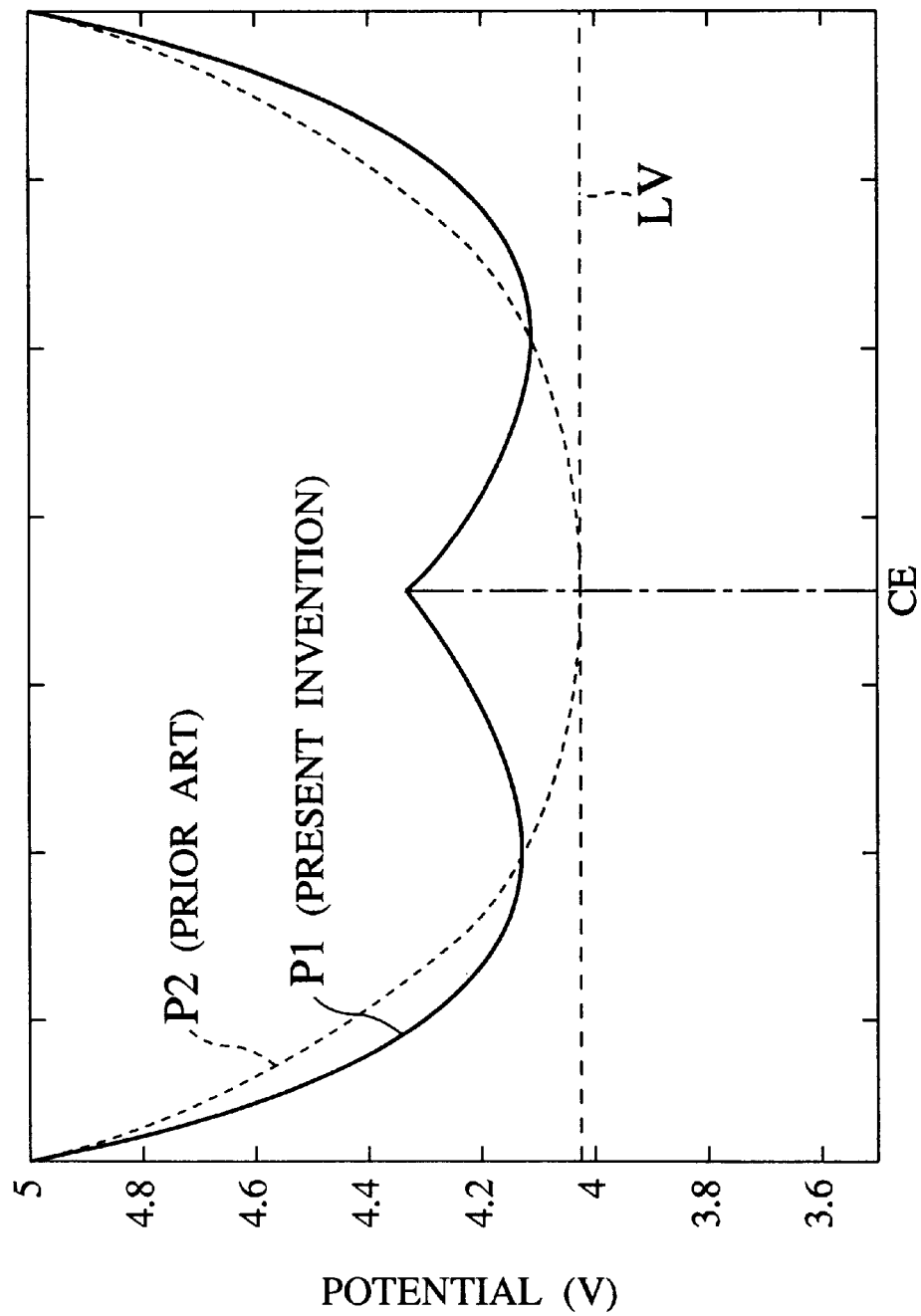

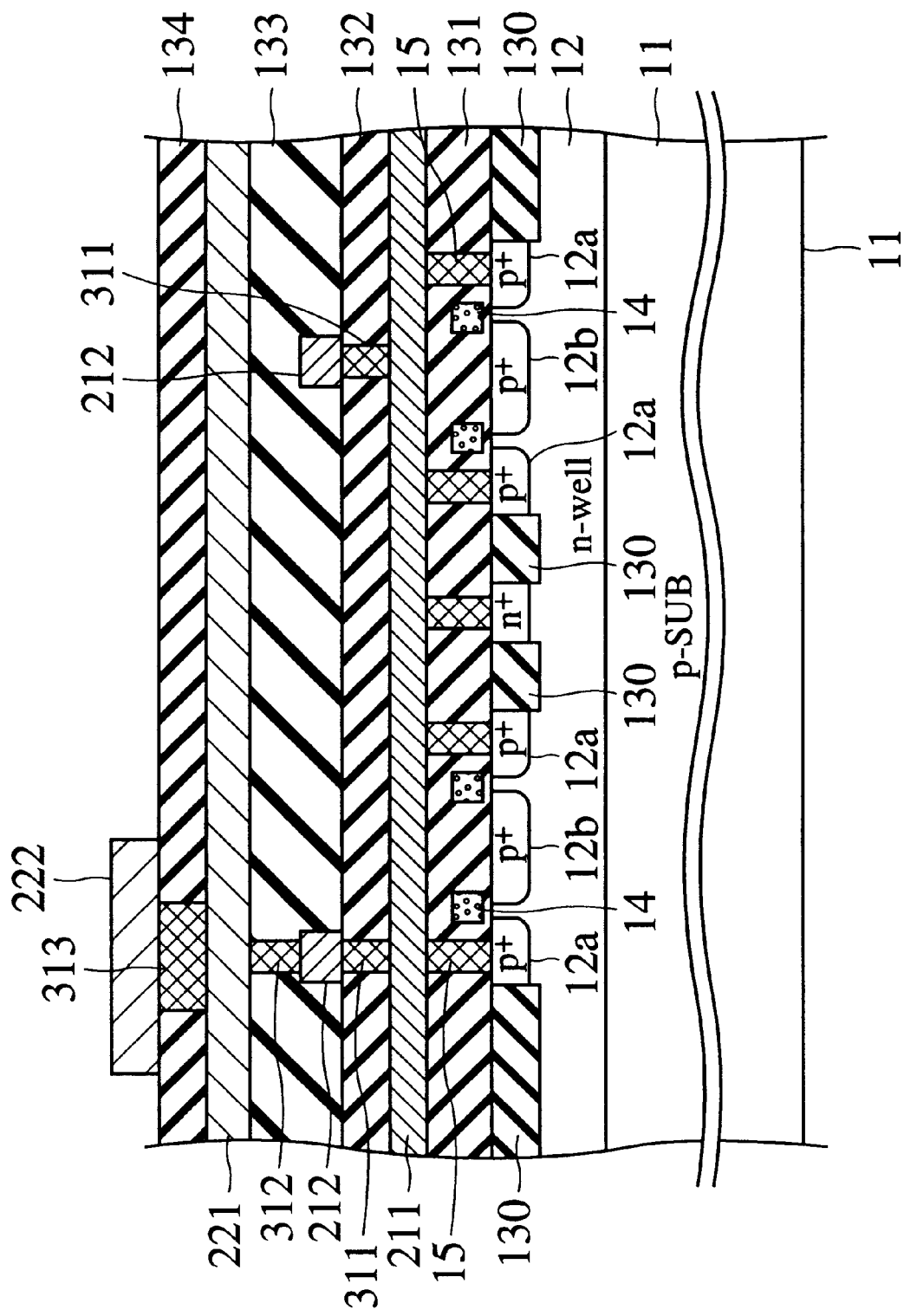

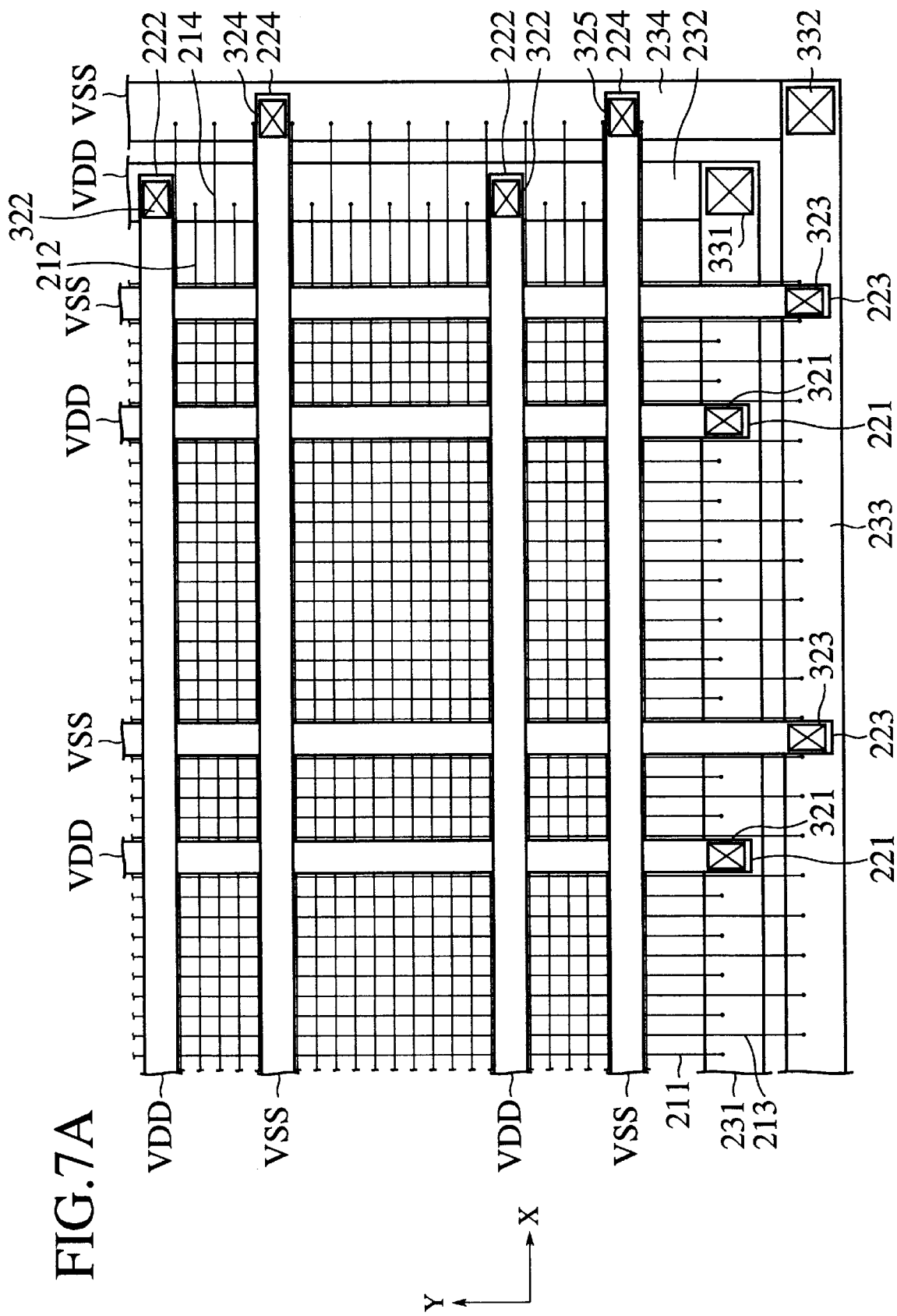

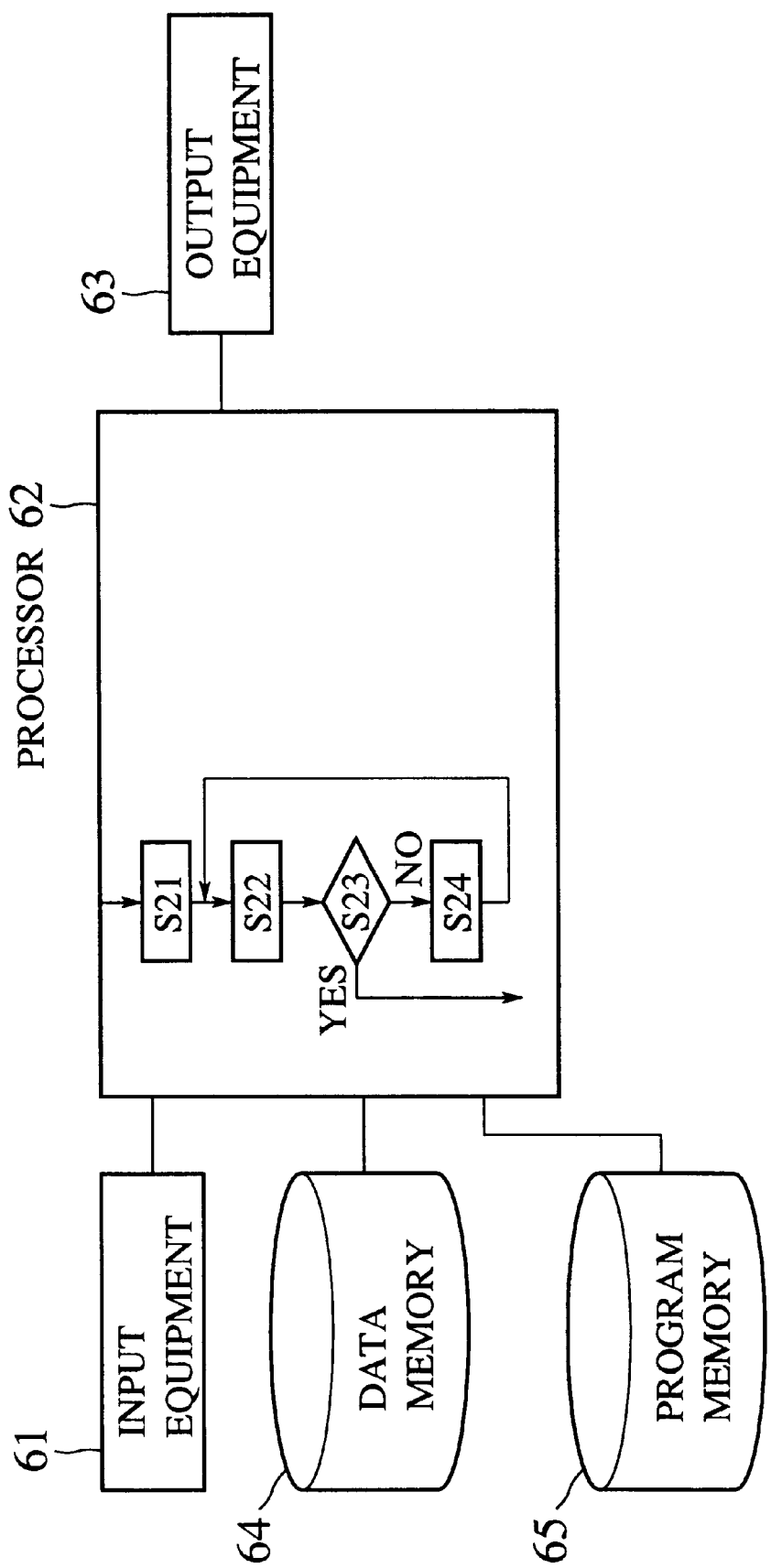

INTEGRATED CIRCUIT, DESIGN METHOD FOR THE SAME, AND MEMORY STORING THE PROGRAM FOR EXECUTING THE DESIGN METHOD

BACKGROUND OF THE INVENTION

1. Field of the Invention

The present invention relates in general to LSI and other semiconductor integrated circuits, a design method for the same, and a memory storing the program for executing the design method, and more particularly to semiconductor integrated circuit power supply lines, a pattern layout design method for the same, and a program storage device readable by a design system to perform the pattern layout design method.

2. Description of the Related Art

Recently, a tendency for a larger scale and a higher density of logic LSIs has increased an operating current flowing through the power supply lines on an LSI chip. The line width, on the other hand, has been reduced due to ever finer patterning, which would lead to, along with the increased operating current, a larger potential distribution caused by an increased resistance of the power line. A trouble which cannot be missed is that a portion of logic gates subject to a large potential distribution suffers from a slow operation speed and malfunctioning. A conventional countermeasure against the potential distribution is an addition of supplemental power lines to the fundamental power lines directly connected to logic circuits.

FIG. 1 is a plan view for a conventional pattern of disposing contact holes and/or via holes in power lines within a logic LSI. FIG. 1 specifically shows, as an example of logic LSI, a power supply line combination of fundamental power lines 101 disposed in grid within a logic circuit and the corresponding horizontal supplemental power lines 102. In this example, each of intersections between the vertical fundamental power lines 101 and the horizontal supplemental power lines 102 has each via hole 103, through which those two types of power lines are electrically interconnected, to supply power to the logic circuits. The operating current flows through all the power supply lines within the circuit and to the power supply ring outside the circuit and then to the power supply pin. Since a potential distribution due to this operating current is proportional to a power supply line resistance measured from the center of the circuit to the outside the circuit, it becomes larger as it gets near the center of the circuit.

As shown in FIG. 1, the conventional logic LSIs have via holes disposed at every intersection between fundamental power lines and supplemental power lines. Actually, however, even with an arrangement of such supplemental power lines and via holes, potential distribution cannot sufficiently be suppressed, resulting in possible malfunction of the circuits.

FIG. 2 shows the potential distribution in the conventional logic LSI. This graph shows an actual potential distribution along a line parallel to the X direction (see, FIG. 1) through the circuit center CE, at which the voltage drops largest. This logic LSI has almost the same structure as the structure shown in FIG. 1, which comprises 300 vertical (Y-directional) fundamental power lines 101 in the first level layer, 100 horizontal (X-directional) fundamental power lines 101 in the second level layer, and 9 horizontal (X-directional) supplemental power lines 102 in the second level layer. Each of the supplemental power lines 102 is disposed for each 10 second layer (X-directional) fundamental power lines, having a width 10 times that of the second layer fundamental powerlines 101.

As can be seen from FIG. 2, the circuit center CE with the largest voltage drop is susceptible to an actual potential distribution down to a limit level (LV in the figure, e.g., 4.03V), at which the circuits may malfunction.

SUMMARY OF THE INVENTION

In view of the above-mentioned problems, it is an object of the present invention to provide a semiconductor integrated circuit that assures both the relaxation of a variation in a potential distribution of power supply lines and the stable operations of the circuits.

Another object of the present invention is to provide a design method for layouting a power supply line pattern in a semiconductor integrated circuit that optimizes the number and the positions of contact holes (via holes) at intersections between the fundamental power lines and the supplemental power lines so as to minimize a potential drop and to relax the variation in a potential distribution on power supply lines.

A further object of the present invention is to provide a memory storing programs for executing the pattern layout design method that optimize the number and the positions of contact holes (via holes) disposed at intersections between the fundamental power lines and the supplemental power lines so as to minimize the potential drop and to relax the variation in a potential distribution on power supply lines.

To achieve the above-mentioned objects, the first feature of the present invention is such semiconductor integrated circuit that comprises: logic circuits carrying out prescribed logical operations; a first inter-layer insulator film disposed on the logic circuits; first power supply lines disposed on the first inter-layer insulator film and connected to the logic circuits through first contact holes provided in the first inter-layer insulator film; a second inter-layer insulator film disposed above the first power supply lines; and second power supply lines disposed on the second inter-layer insulator film and connected to the first power supply lines through the second contact holes in the second inter-layer insulator film, the number and the positions of which holes are predetermined so as to minimize the potential distribution of the logic circuits. The first inter-layer insulator film is here the first layer deposited directly on the source, drain, and gate regions of transistors of the logic circuits and the first power supply lines are directly connected to those source and drain regions of transistors, while the second inter-layer insulator film here may come in the second-level, third-level, or fourth-level inter-layer insulator film.

If, for example, the second inter-layer insulator film is the fourth level insulation film, the corresponding power supply structure is a quadruple level. In this case, the power supply line structure comprises: the second-level inter-layer insulator film disposed on the first power supply lines; the third power supply lines disposed on the second-level inter-layer insulator film; the third-level inter-layer insulator film disposed on the third power supply lines; the fourth power supply lines disposed on the third-level inter-layer insulator film; the fourth-level inter-layer insulator film (the second inter-layer insulator film) disposed on the fourth power supply lines; and the second power supply lines disposed on the fourth-level inter-layer insulator film. Also, to interconnect the fourth and the third power supply lines, the third contact holes are provided through the third-level inter-layer insulator film in such a way that their number and positions may be predetermined so as to reduce to a minimum the potential distribution of the logic circuits. The second contact holes to interconnect the first and the second power supply lines are provided through the fourth-level, third-level, and second-level inter-layer insulator films.

Preferably, the second power supply lines have come in supplemental power lines which electrically supplement the first power supply lines.

According to the first feature of the present invention, the potential drop on power supply lines can be minimized and the variation in potential distribution can be relaxed because the number and the positions of the contact holes (via holes) interconnecting the first and the second power supply lines are optimized.

The second feature of the present invention is a design method of layouting patterns such as power supply lines and contact holes of semiconductor integrated circuits, by which method, out of a series of steps consisting of the first step to dispose first power supply lines on a first inter-layer insulator film and second power supply lines on a second inter-layer insulator film, the second step to subsequently determine a potential distribution at prescribed positions in the line regions, and the third step to increase by one the number of the contact holes interconnecting the first and second power supply lines for the position having the largest potential distribution thus obtained at the second step, the second and the third steps are sequentially repeated until the current potential distribution value is speculated to become larger than the present value as a result of the subsequent performing of the third step. The "contact holes" in this second feature correspond to the "second and/or the third contact holes" of the first feature.

According to the second feature of the present invention, the method checks the potential distribution within the line region, to dispose contact holes starting from the sections with the largest voltage drops, i.e. those sections subject to the largest operation current for voltage drop in such a way as to provide the optimum number and the positions of those contact holes for the relaxation of the potential distribution in the circuits.

The third feature of the present invention lies in a design method for layouting patterns such as power supply lines and contact holes for semiconductor integrated circuits, by which method, out of a series of steps comprising the first step to dispose first power supply lines in the first inter-layer insulator film and second power supply lines in the second inter-layer insulator film and, at the same time, to dispose contact holes at every intersection between the first power supply lines and the second power supply lines, the subsequent second step to obtain a potential distribution throughout in the line region, and the third step to delete one contact hole at a position having a potential maximum obtained at the second step, the second and the third steps are sequentially repeated until the present voltage drop value at a potential minimum is speculated to become larger than the present value as a result of the subsequent performing of the third step. The "contact holes" in the third feature correspond to the "second and/or third contact holes in the first feature.

According to the third feature of the present invention, first, contact holes (via holes) are disposed at every intersection between the first and the second power supply lines, to check a potential distribution in the line region, so that the contact holes (via holes) are deleted starting from a section having the potential maximum, thus optimizing the number and the positions of the contact holes (via holes) to relax the potential distribution of the circuits.

The fourth feature of the present invention is a memory (program storage device) storing a program readable by a design system, or a pattern layout tool to perform the method of layouting power supply line and contact holes for semiconductor integrated circuits which is related to the above-mentioned second feature. By reading the contents of this memory into the pattern layout tool or other design system, the above-mentioned power supply line patterns and contact holes can be generated and layouted. The memory here corresponds to, for example, a magnetic disk, an optical disk, a magneto-optical disk, or a magnetic tape. Specifically, the memory also includes a floppy disk, a CD-ROM, an MO disk, and a cassette tape which can store those programs to perform the pattern layout design method.

The fifth feature of the present invention is a memory storing a program readable by a design system, or a pattern layout tool to perform the method for layouting power line patterns and contact holes for semiconductor integrated circuits which is related to the above-mentioned third feature. By reading the contents of this memory into the pattern layout tool or other design system, the above-mentioned power supply line patterns and contact holes can be generated and layouted. The memory here may correspond to a magnetic disk, an optical disk, a magneto-optical disk, a magnetic tape.

Other and further objects of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 3C is an enlarged view of part B* of FIG. 3B, illustrating basic cells in a gate array;

FIG. 3D is an enlarged view of part A* of FIG. 3A, illustrating the detailed relationship between fundamental power lines and supplemental power lines;

FIG. 4 shows a potential distribution in a pattern of power supply lines according to the present invention as compared to a prior art;

FIG. 6B is a cross-sectional view taken along II—II in FIG. 6A;

FIG. 7A shows a connection relationship between the fundamental and supplemental power lines and the power supply rings;

FIG. 18B is a block diagram of a system configuration employed when performing the design method of the second embodiment of the present invention.

DETAILED DESCRIPTION OF THE EMBODIMENTS

Figure 1:
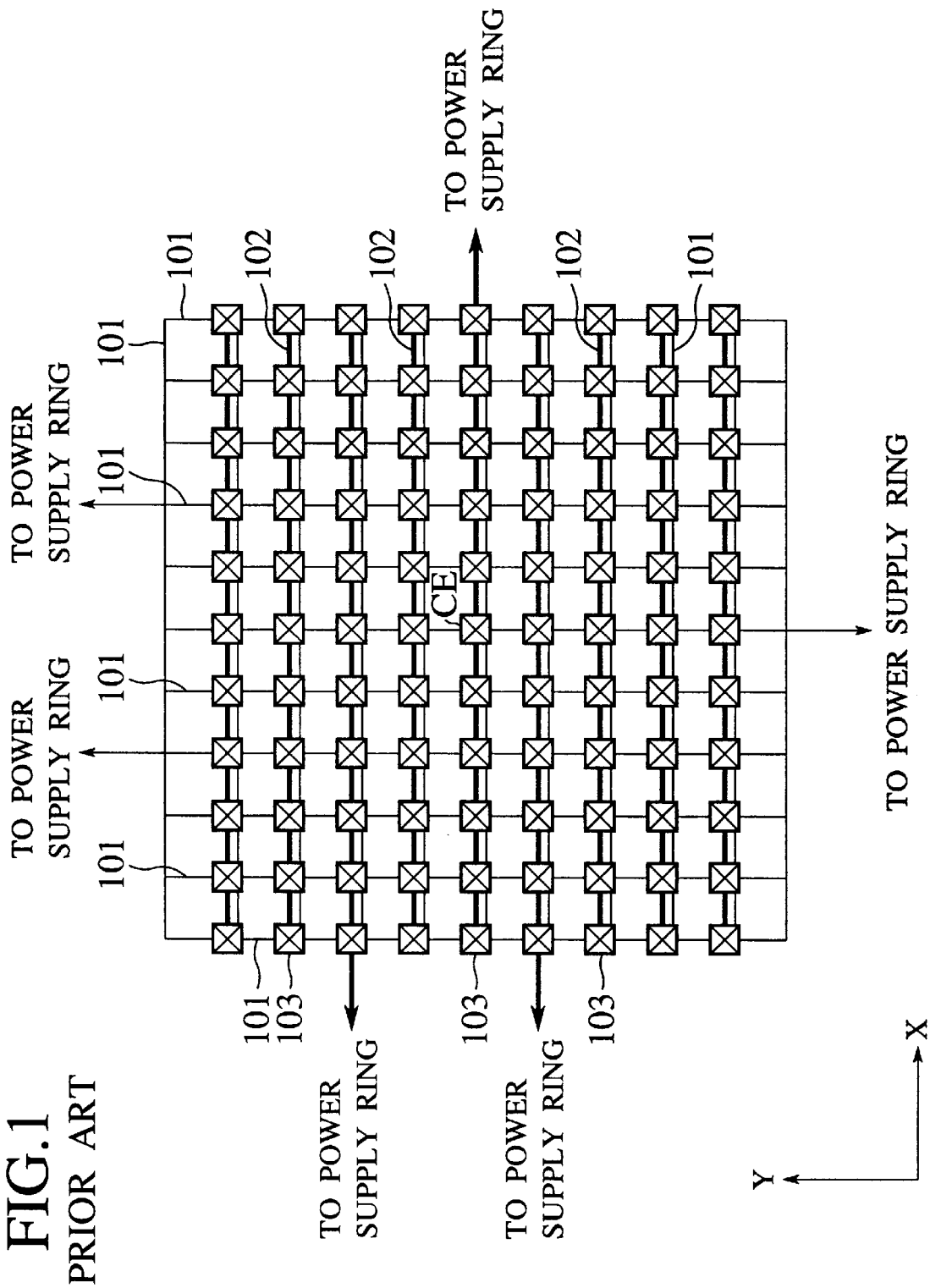
FIG. 1 is a plan view of a pattern for disposing contact holes (via holes) on power supply lines within a conventional logic LSI.
Figure 2:
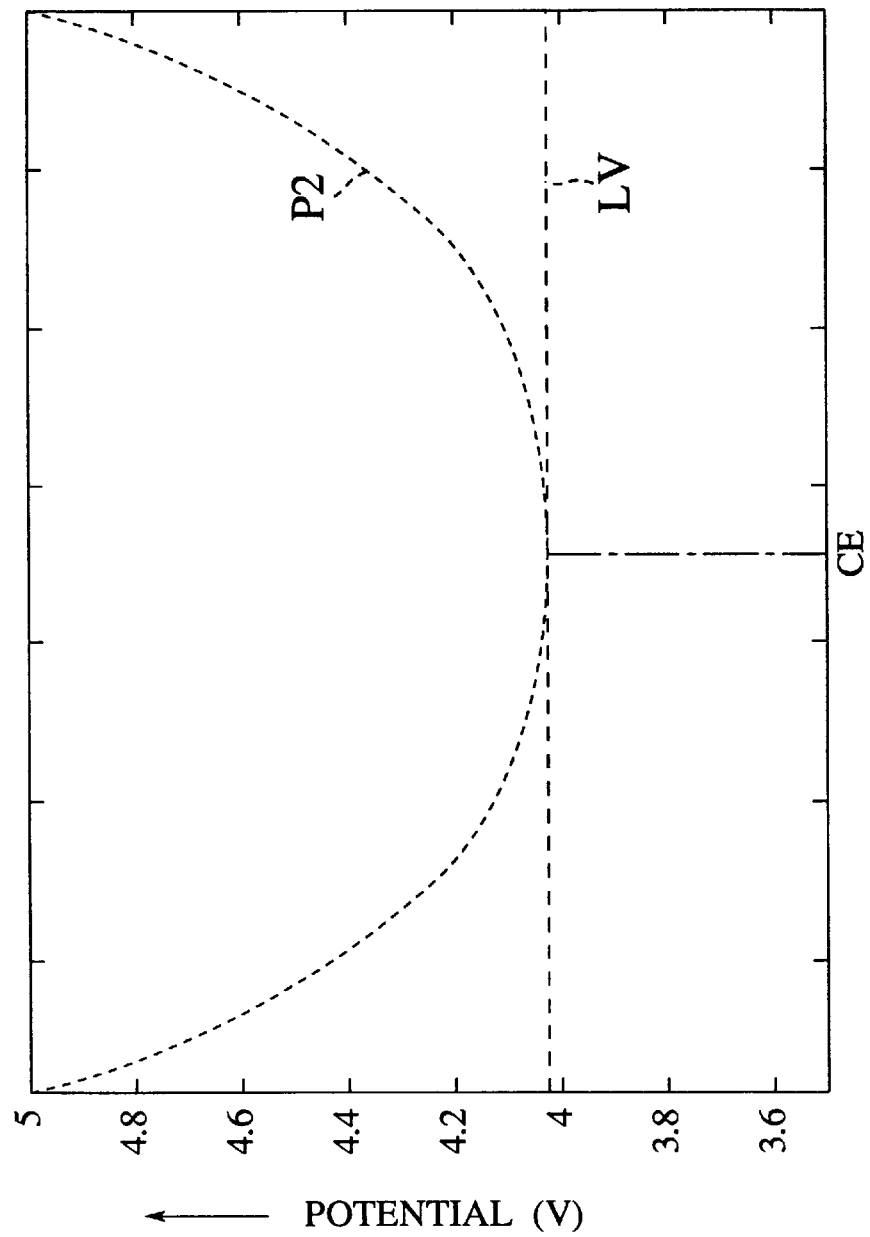
FIG. 2 is a graph indicative of a potential distribution along a line parallel to an X direction passing through the circuit center CE.

Various embodiments of the present invention will be described with reference to the accompanying drawings. It is to be noted that the same or similar correspondence numerals are applied to the same or similar parts and elements throughout the drawing, and the description of the same or similar parts and elements will be omitted or simplified.

(FUNDAMENTAL PRINCIPLE)

Figure 3A:
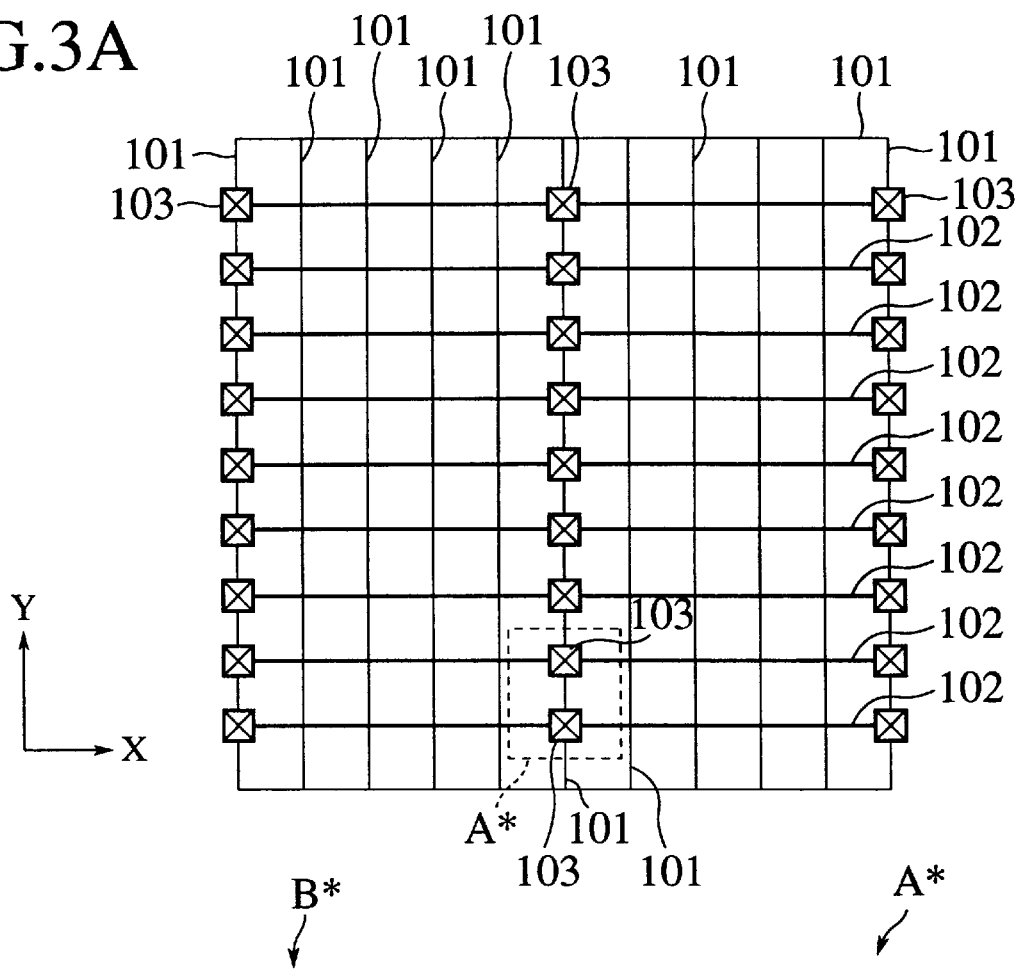
FIG. 3A illustrates a pattern for disposing contact holes (via holes) on power supply lines, indicative of the fundamental principle of semiconductor integrated circuits of the present invention.
Figure 3B:
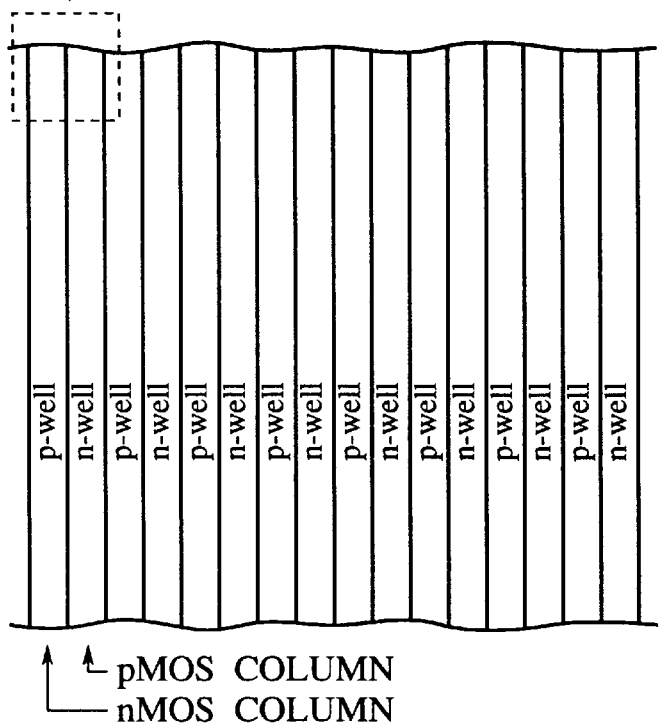
FIG. 3B is an enlarged view of part A* of FIG. 3A, illustrating pMOS columns and nMOS columns.

First, the fundamental principles of the present invention are described with reference to FIGS. 3A to 3D. FIGS. 3A through 3D show a pattern for disposing contact holes (via holes) provided at power supply lines in a semiconductor integrated circuit, to describe the fundamental principles of the present invention. FIG. 3A is a total view and FIG. 3B is an enlarged view of part A* of FIG. 3A, showing pMOS columns and nMOS columns. As shown in FIG. 3B, n-wells and p-wells are disposed alternately, to make up a gate array. FIG. 3C is an enlarged view of part B* of FIG. 3B, showing basic cells of the gate array. In a p-well 22 of the gate array's basic cell shown in FIG. 3C are formed an $n^+$ source region 22a, $n^+$ drain region 22b, $p^+$ contact region 22c, and gate polysilicon region 24. In the n-well 12, on the other hand, are formed a $p^+$ source region 12a, a $p^+$ drain region 12b, an $n^+$ contact region 12c, and a gate polysilicon region 14. As shown in FIG. 3C, the $p^+$ source region 12a of the gate array's basic cell is connected to a high-potential power supply line (VDD) 101a, while the $n^+$ source region 22a is connected to a low-potential power supply line (VSS) 201a. The following will provide description mainly about only the high-potential power supply line (VDD). FIG. 3D is an enlarged view of part A* of FIG. 3A, showing the detailed relationship between fundamental power lines 101a through 101h, which act as the high-potential power supply lines (VDD), and supplemental power lines 102. In FIG. 3D, only one fundamental power line 101d out of the vertical eight fundamental power lines 101a through 101h is connected through a via hole 103 to a supplemental power line 102. As shown in FIG. 3A, according to a pattern disposing via holes for power supply lines of the present invention, via holes 103 are disposed only at the center and both ends of each supplemental power line 102 but not at the intersections between the other fundamental power lines 101 and the supplemental power lines 102. FIG. 4 shows, as compared to a prior art potential distribution graph, a potential distribution along a line parallel to the X direction passing through the circuit center CE, where the Y-directional voltage drop measurement is the largest, in the case where via holes 103 are disposed each at the center as shown in FIGS. 3A through 3D. A solid line P1 in FIG. 4 represents a potential distribution in the case of a via hole disposing pattern shown in FIGS. 3A through 3D. A broken line P2, on the other hand, plots again a prior art case of potential distribution shown in FIG. 1.

As can be seen from FIG. 4, as compared to the prior art where the via holes 103 are disposed at every intersection between the fundamental power lines 101 and the supplemental power lines, the case where the via holes 103 are disposed at only both ends and the center of the supplemental power lines 102 has relaxed voltage drops at the circuit center CE and at the lowest potential positions at its both wings. Therefore, the present invention prevents potential from dropping down below to a limit level of possible circuit malfunctioning.

Thus, the present invention is based on a verified fact that by not disposing contact holes (via holes) at every intersection between fundamental and supplemental power lines within a logic LSI, the voltage drop at the lowest potential positions may rather be relaxed, thus reducing the variation in a potential distribution on the circuit as a whole. In the following embodiments, specific methods are described which optimize the number and the positions of contact holes (via holes) disposed at the intersections between fundamental and supplemental power lines.

(FIRST EMBODIMENT)

Figure 5:
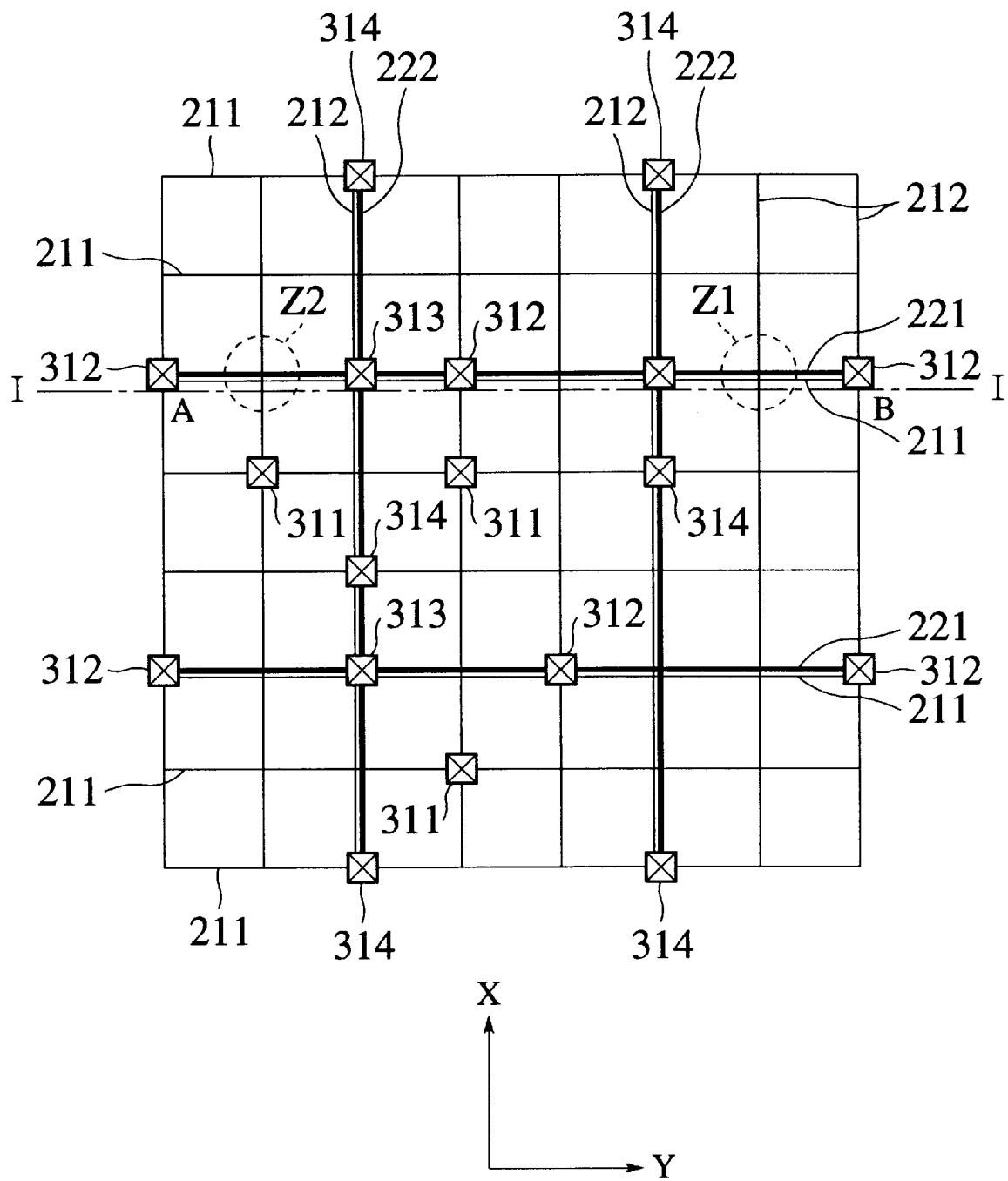
FIG. 5 is a plan view of a pattern for disposing contact holes (via holes) on power supply lines within a logic LSI related to a first embodiment of the present invention.
Figure 6A:
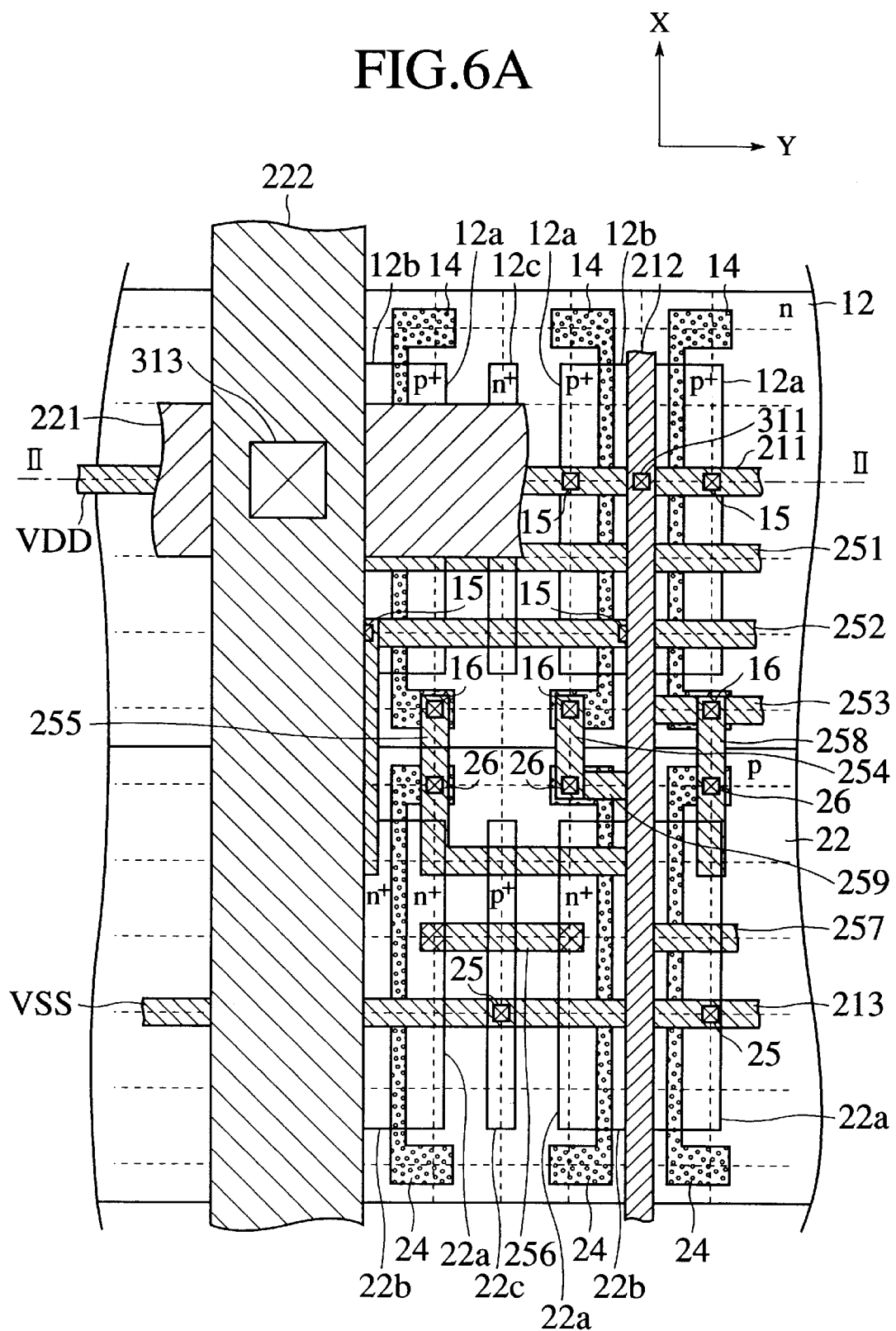
FIG. 6A is a plan view showing the details of part of the structure within the logic LSI of FIG. 5.

The configuration of a first embodiment of the present invention is described below with reference to FIGS. 6A and 6B. FIG. 6A is a plan view of the details of a part of the internal structure of the logic LSI shown in FIG. 5, illustratng a NAND gate with four inputs and one output which is provided at basic cells (primitive cells) in the gate array. FIG. 6B, on the other hand, is a cross-sectional view taken along II—II in FIG. 6A.

The basic cells in the gate array shown in FIG. 6A employ mutually adjacent n-wells 12 and p-wells 22 in a semiconductor substrate, to constitute CMOS logic circuits (NAND circuits).

The n-well 22 comprises therein p+ source regions 12a, p+ drain regions 12b, an n+ contact region 12c, and gate polysilicon regions 14. The p-well 22, on the other hand, comprises therein n+ source regions 22a, n+ drain regions 22b, a p+ contact region 22c, and gate polysilicon regions 24. As shown in FIG. 6A, the p+ source region 12a and the n+ contact region 12c on the side of the pMOS transistor are connected via contact holes 15 to a first-level higher-potential fundamental power line (VDD) 211. The n+ source region 22 and the p+ contact region 22c on the side of the nMOS transistor are connected via contact holes 25 to a first-level lower-potential fundamental power line (VSS) 213. A second-level higher-potential power supply line (VDD) 212 is provided perpendicular to the first-level higher-potential fundamental power line (VDD) 211; a third-level higher-potential supplemental power line (VDD) 221 is provided perpendicular to the second-level higher-potential fundamental power line (VDD) 212; and a fourth-level higher-potential supplemental power line (VDD) 222 is provided perpendicular to the third-level higher-potential supplemental power line (VDD) 221. Here, "first-level higher-potential fundamental power line (VDD) 221" corresponds to "first power supply line" of the present invention; "fourth-level higher-potential supplemental power line (VDD) 222" corresponds to "second power supply line" of the present invention; and "second-level higher-potential fundamental power line (VDD) 212" and "third-level higher-potential supplemental power line (VDD) 222" correspond to "third power supply line" and "fourth power supply line" of the present invention respectively. Also, "contact hole 15" corresponds to "first contact hole" of the present invention.

The line width of the third-level higher-potential supplemental power lines (VDD) 221 and the fourth-level higher-potential supplemental power lines (VDD) 222 are designed to be equal to or larger than that of the first-level higher-potential fundamental power lines (VDD) 211 or the second-level higher-potential fundamental power lines (VDD) 212.

FIG. 6A shows various signal lines as well as those power supply lines 211, 212, 213, 221, and 222. For example, first-level input signal lines 251, 253, 257, and 259 are connected via contact holes 16 and 26 respectively to gate polysilicon regions 14 and 24, while first-level output signal lines 252 are connected via contact holes 15 and 25 respectively to the n+ drain region 22b and the p+ drain region 12b. Also, the gate polysilicon regions 14 and 24 are interconnected with second-layer signal lines 254, 255, 258, etc. via the contact holes 16 and 26.

The following will describe, with reference to FIG. 6B, the relationship between the first-level higher-potential fundamental power lines (VDD) 211, the second-level higher-potential power supply lines (VDD) 212, the third-level higher-potential supplemental power lines (VDD) 221, and the fourth-layer higher-potential supplemental power lines (VDD) 222. As shown in FIG. 6B, in a semiconductor integrated circuit (logic LSI) related to the first embodiment, in and at the upper side of a p-type semiconductor substrate 11 is formed an n-well region 12, in and at upper side of which are formed p+ source regions 12a, p+ drain regions 12b, and n+ contact regions 12c of each of pMOS transistors constituting a logic circuit. The nMOS transistors are isolated by element-isolation regions 130, or the shallow trench isolation (STI) regions 130 from each other. On the surface of the p-type semiconductor substrate 11, a first-level inter-layer insulator film 131 is formed. Here, "first-level inter-layer insulator film 131" corresponds to "first inter-layer insulator film" of the present invention. Into the first-level inter-layer insulator films 131, gate electrodes (gate polysilicon regions) 14 of the pMOS transistors are embedded and formed. The gate electrodes (gate polysilicon regions) have of course gate insulator films under themselves. On the first-level inter-layer insulator film 131, the first-level higher-potential fundamental power lines (VDD) 211 are provided, to interconnect the p+ source regions 12a and the n+ contact regions 12c via the contact holes 15. The first-level higher-potential fundamental power lines (VDD) 211 are provided, for example, as many as 350 vertically (in the Y direction). On the first-level higher-potential fundamental power lines (VDD) 211 is formed a second-level inter-layer insulator film 132, on which are formed the second-level higher-potential fundamental power lines (VDD) 211 as many as 86 horizontally (in the X direction). The second-level higher-potential fundamental power supply lines (VDD) 212 and the first-level higher-potential fundamental power lines (VDD) 211 are interconnected via the first via holes 311 provided in the second-level inter-layer insulator film 132.

On the second-level higher-potential fundamental power lines (VDD) 212 is formed a third-level inter-layer insulator film 133, on which are formed the third-level higher-potential power supply lines (VDD) 221 in the Y direction. The third-level higher-potential supplemental power lines (VDD) 221 and the second-level higher-potential fundamental power lines (VDD) 212 are interconnected via second via holes 312 provided in the third-level inter-layer insulator film 133. This "second via hole 312" corresponds to "third contact hole" of the present invention. It should be noted here that the second via holes (third contact holes) 312 are not disposed at every intersection between the third-level higher-potential supplemental power lines (VDD) 221 and the second-level higher-potential fundamental power supply lines (VDD) 212, so that those power lines 221 and 212 are not interconnected at the intersections other than particular ones.

On the third-level higher-potential supplemental power lines (VDD) 221 is formed a fourth-level inter-layer insulator film 134, on which are formed fourth-level higher-potential supplemental power lines (VDD) 222 in the X direction. Here, "fourth-level inter-layer insulator film 134" corresponds to "second inter-layer insulator film". And "second- and third-level inter-layer insulator film 132, 133" correspond to "third and fourth inter insulator film" of the present invention, respectively. The fourth-level higher-potential supplemental power lines (VDD) 222 and the third-level higher-potential supplemental power lines (VDD) 221 are interconnected via third via holes 313 provided in the fourth-level inter-layer insulator film 134.

Also, as shown in FIG. 5, fourth via holes 314 can be disposed at the intersections between the fourth-level higher-potential supplemental power lines (VDD) 222 and the first-level higher-potential fundamental power lines (VDD) 211. This "fourth via hole 314" corresponds to "second contact hole" of the present invention. It should also be noted that the fourth via holes 314, which act as contact holes (via holes) penetrating through the fourth-level, third-level, and second-level inter-layer insulator films 134, 133, and 132, are not disposed at every intersection between the fourth-level higher-potential supplemental power lines (VDD) 222 and the first-level higher-potential fundamental power lines (VDD) 211. In the contact holes and the first through fourth via holes 311, 312, 313, and 314, first through fifth plug conductors are embedded, respectively. The first through fifth plug conductors may come in doped polysilicon, refractory metal, such as Tungsten (W), Molybdenium (Mo), Titanium (Ti), Cobalt (Co), or silicide of the refractory metal such as $WSi_2$, $MoSi_2$, $TiSi_2$, $CoSi_2$.

Figure 7B:
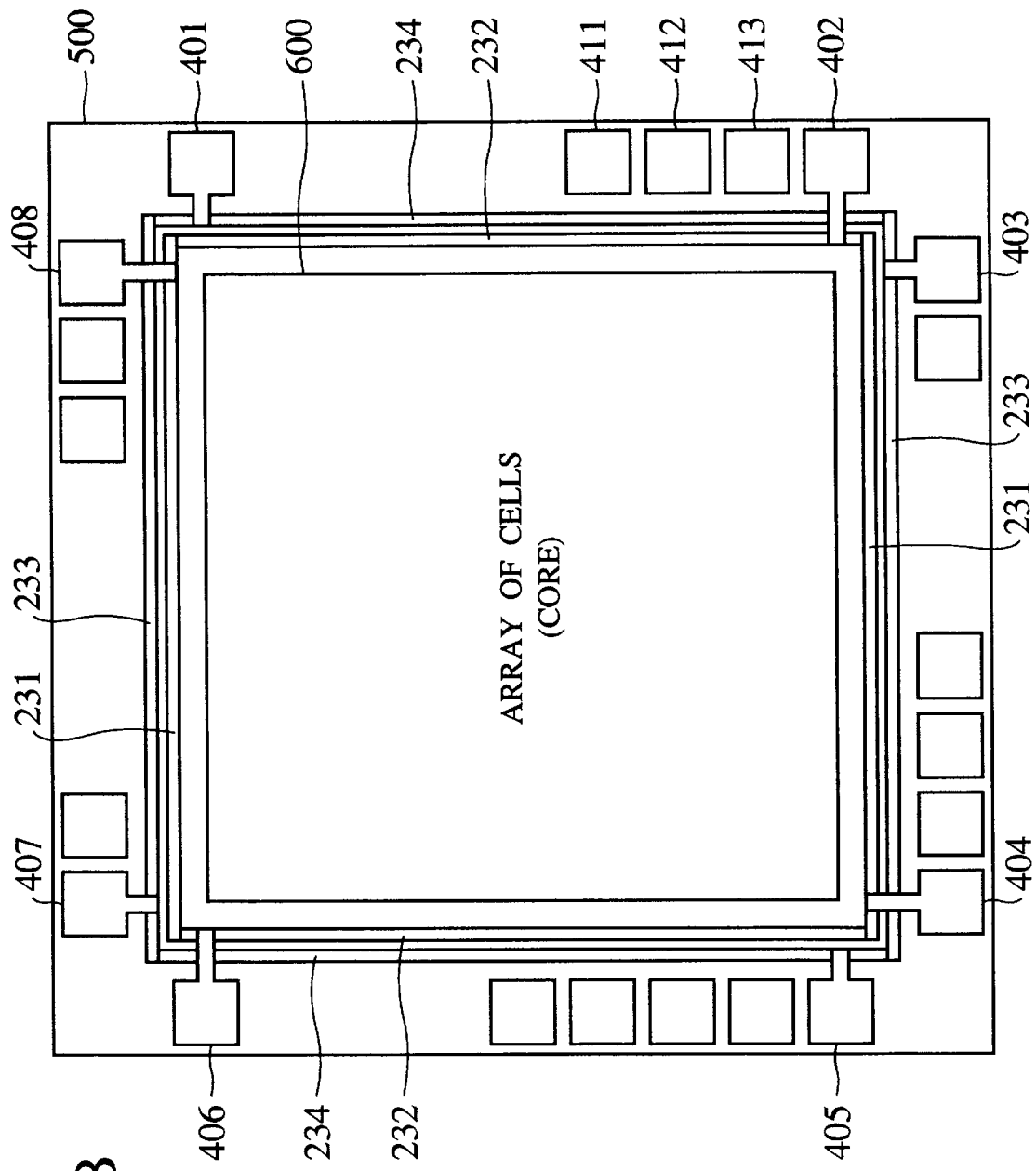
FIG. 7B is a plan view of the entire LSI chip according to the present invention.

FIG. 7A shows a connection relationship between the fundamental and supplemental power lines and the power supply rings, while FIG. 7B is a plan view of the entire LSI chip of the present invention. As shown in FIGS. 7A and 7B, an LSI chip 500 comprises at its periphery a first-level higher-potential power supply ring 232 and a lower-potential power supply ring 234 and a second-level higher-potential power supply ring 231 and a lower-potential power supply ring 233, which all surround a core 600. The first-level higher-potential power supply ring 232 is connected through via holes 331 to the second-level higher-potential power supply ring 231, while the first-level lower-potential power supply ring 234 is connected through via holes 332 to the second-level lower-potential power supply ring 233. As shown in FIG. 7A, the first-level higher-potential fundamental power supply lines (VDD) 211 and the third-level higher-potential supplemental power lines (VDD) 221 are connected to the second-level higher-potential power supply ring 231, while the second-level higher-potential fundamental power lines (VDD) 212 and the fourth-level higher-potential supplemental power lines (VDD) 222 are connected to the first-level higher-potential power supply ring 232. Also, the first-level lower-potential power supply lines (VSS) 213 and the third-level lower-potential supplemental power lines (VSS) 223 are connected to the second-level higher-potential power supply ring 233, while the second-level lower-potential fundamental power lines (VSS) 214 and the fourth-level lower-potential supplemental power lines (VSS) 224 are connected to the first-level lower-potential power supply ring 234. As shown in FIG. 7B, the first-level higher-potential power supply ring 232 and the lower-potential power supply ring 234 and the second-level higher-potential power supply ring 231 and the lower-potential power supply ring 233 are respectively connected to power supply bonding pads 402, 401, 404, and 403 provided at the outermost periphery of the LSI chip 500 and, through these bonding pads, to the power supply pins of the LSI package. Besides these bonding pads, various bonding pads 411, 412, . . . for input and output signals etc. are disposed at the outermost periphery of the LSI chip 500.

The first embodiment of the present invention optimizes, by use of an optimization method described later, both the number and the positions of the second via holes (third contact holes) 312 interconnecting the third-level higher-potential supplemental power lines (VDD) 221 and the second-level higher-potential fundamental power lines (VDD) 211. And the number and the positions of the fourth via holes (second contact holes) 314 interconnecting the fourth-level higher-potential supplemental power lines (VDD) 222 and the first-level higher-potential fundamental power lines (VDD) 211 are also optimized by use of the optimization method. That is, a via-hole disposition pattern shown in FIG. 5 is designed to such an optimum pattern of disposing the second via holes 312 and the fourth via holes 314 that will suffer further voltage drops at the largest voltage drop position, during the operation of the circuits, once even one of the second via holes 312 or the fourth via holes 314 is deleted or added.

Figure 8:
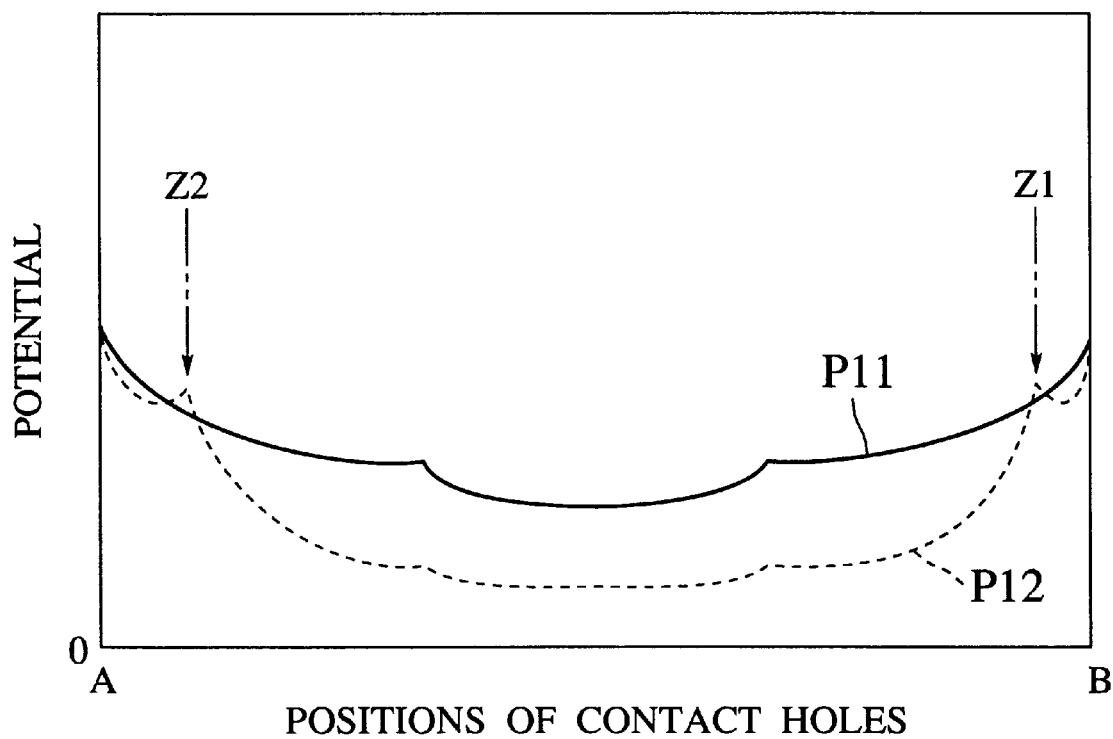
FIG. 8 is a graph showing the potential distribution before and after one contact hole (via hole) is deleted from a contact hole (via hole) disposing pattern by a power supply line pattern generation method related to the first embodiment of the present invention.

For example, when the via holes 312 are not disposed at intersections Z1 or Z2 (i.e., in the case of an optimized disposition pattern in FIG. 5), such a voltage drop is given as represented by the solid line P11 in FIG. 8; when, on the other hand, the second via holes 312 are disposed at the intersections Z1 and Z2, such a potential distribution as represented by the broken line P12 in FIG. 8 is provided, indicating the increased voltage drop to worsen the situation. Note here that the graph of FIG. 8 shows a potential distribution between points A and B of a cross section taken along I—I (the Y direction) passing through a position (the circuit center) having the largest voltage drop as measured in the X direction in FIG. 5.

Thus, a logic LSI with such a power-supply via hole disposition pattern as shown in FIG. 5 can relax voltage drop for assuring of the reliable circuit operations and higher performances than with such a pattern that disposes the second via holes 312 and the fourth via holes 314 at respectively all the intersections between the third-level higher-potential supplemental power lines (VDD) 221 and the second-level higher-potential fundamental power lines (VDD) 212 and at every intersection between the fourth-level higher-potential supplemental power lines (VDD) 222 and the first-level higher-potential power supply lines (VDD) 211.

Figure 9:
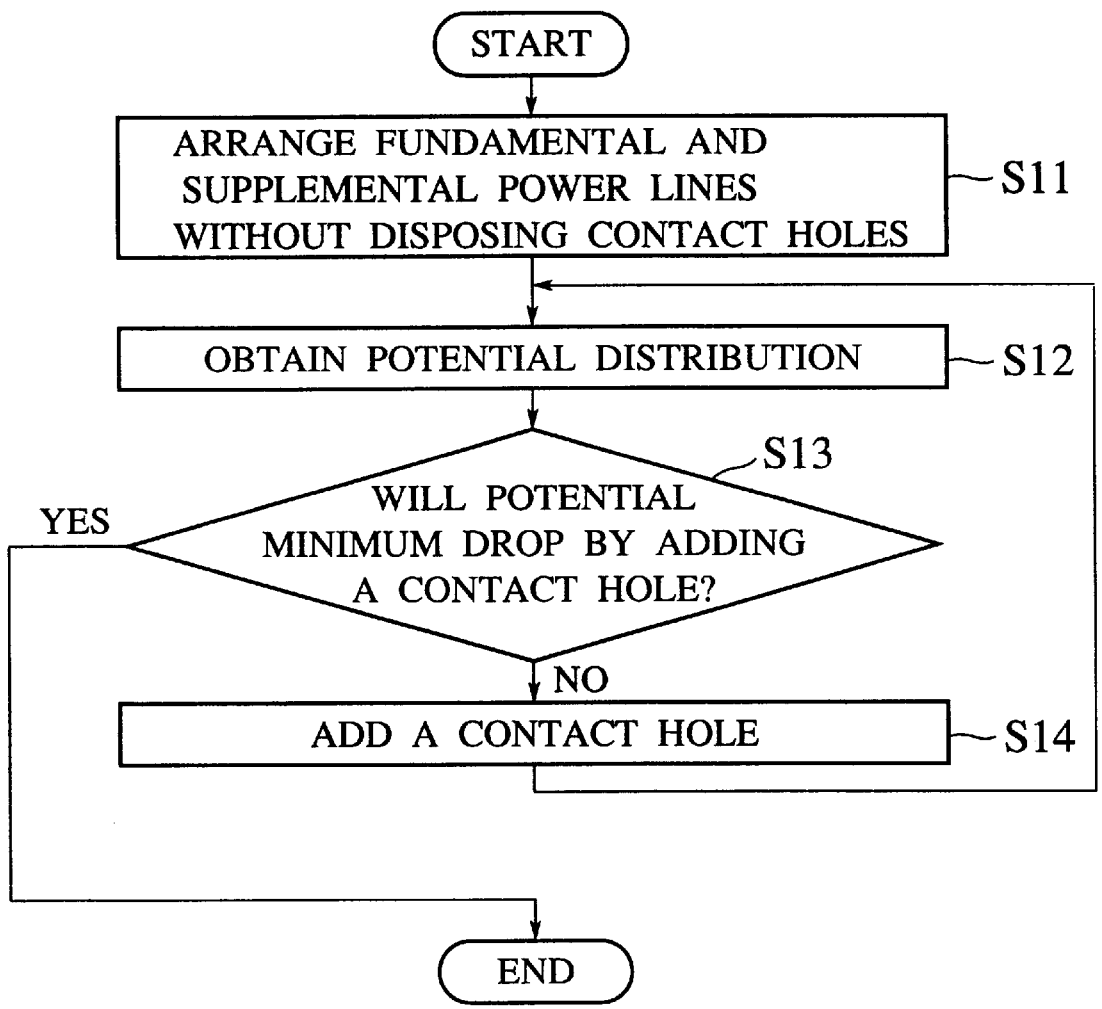
FIG. 9 is flowchart of a power supply line pattern generation method of the first embodiment of the present invention.

Now, the following will describe a power supply line pattern generation method having a via hole disposition pattern shown in FIG. 5 with reference to a flowchart of FIG. 9. This flowchart is explained only for higher-potential power supply lines (VDD), because the operations are the same as with lower-potential power supply lines (VSS).

Figure 10:
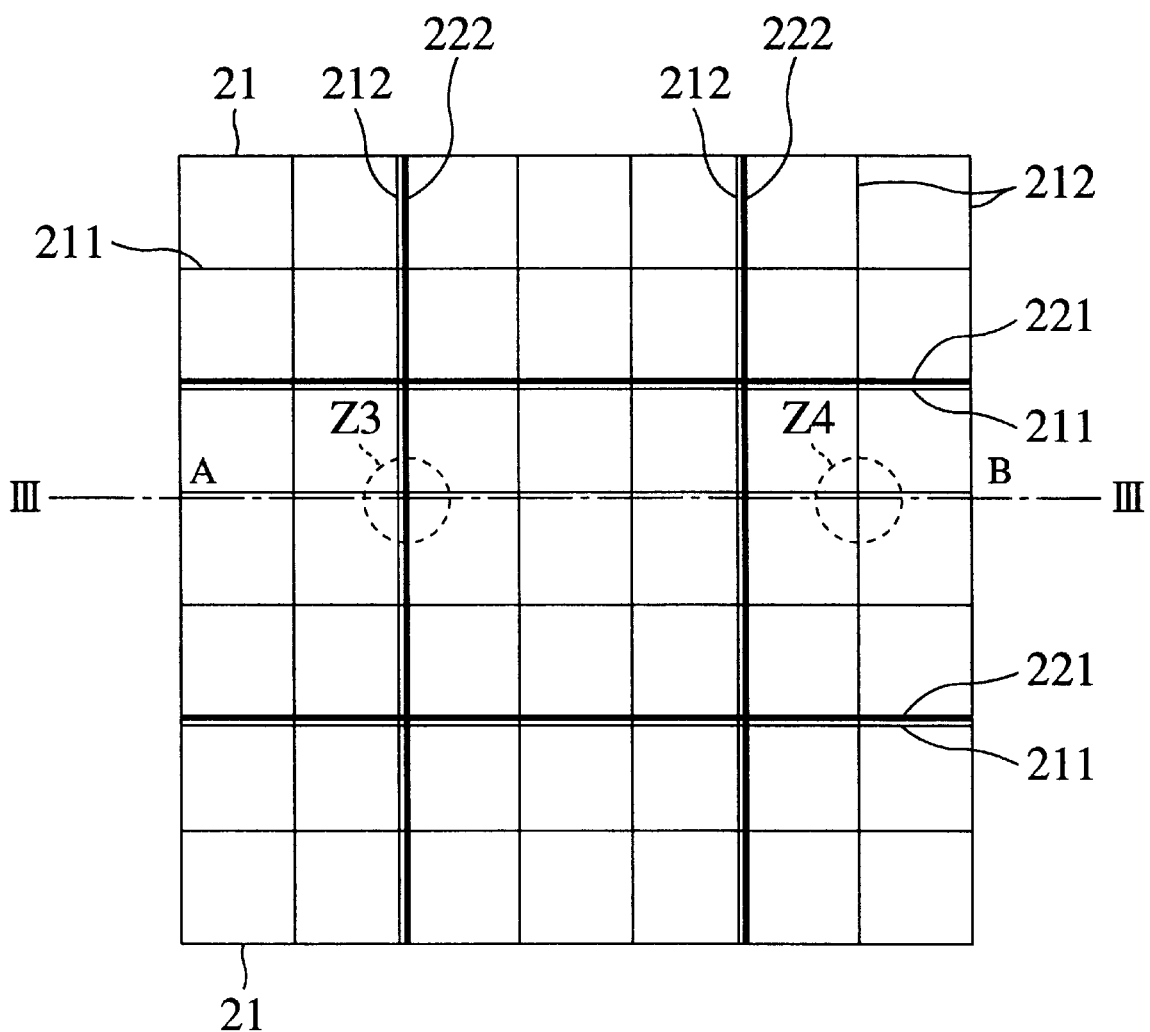
FIG. 10 shows a pattern for disposing contact holes (via holes) at step S11 of FIG. 9.

First, at step S11, first-level higher-potential fundamental power lines, second-level higher-potential fundamental power lines 212, third-level higher-potential supplemental power lines 221, and fourth-level higher-potential supplemental power lines 222 are wired throughout the chip of a logic LSI. At this point in time, neither second via holes 312 nor fourth via holes 314 are disposed at the intersections between the third-level higher-potential supplemental power lines 221 and the second-level higher-potential fundamental power lines 211 and at the intersections between the fourth-level higher-potential supplemental power lines 222 and the first-level higher-potential fundamental power lines 211. This state is shown in FIG. 10.

At the next step S12, the circuit is verified and computed, to obtain a potential distribution at various points on the chip during circuit operations, thus working out the position having the largest voltage drop, or the potential minimum. This generation of the potential minimum is ascribable to a phenomenon that an operation current required for the operations of the transistors flows from the first-level higher-potential fundamental power lines 211 to the pMOS transistors in a CMOS logic LSI and then, from nMOS transistors to a ground line (first-level lower-potential fundamental power lines (VSS)) 213, thereby lowering the supply voltage at the higher-potential fundamental power lines 211 and raising it at the lower-potential fundamental power lines (VSS) 213. This phenomenon of voltage drop is verified and computed over the entire chip of the logic LSI by use of, for example, SPICE analysis, to obtain potential and voltage drop at various positions in the logic LSI.

At step S13, when the second via holes 312 or the fourth via holes 314 are added by one, it is speculated whether "the potential minimum" within the logic LSI would become larger than the present (I'th) voltage drop. At the first trial of decision, where neither the second via holes nor the fourth via holes are disposed, step S13 gives a decision result of negation (NO), therefore, control goes directly to step S14. That is, step S13 decides whether one via hole 312 or 314, if it were added at the subsequent (I+1)'th procedure, would make the voltage drop at the potential minimum in the logic LSI larger than the voltage drop with the present (I'th) disposition of the via holes 312 or 314.

Figure 11A:
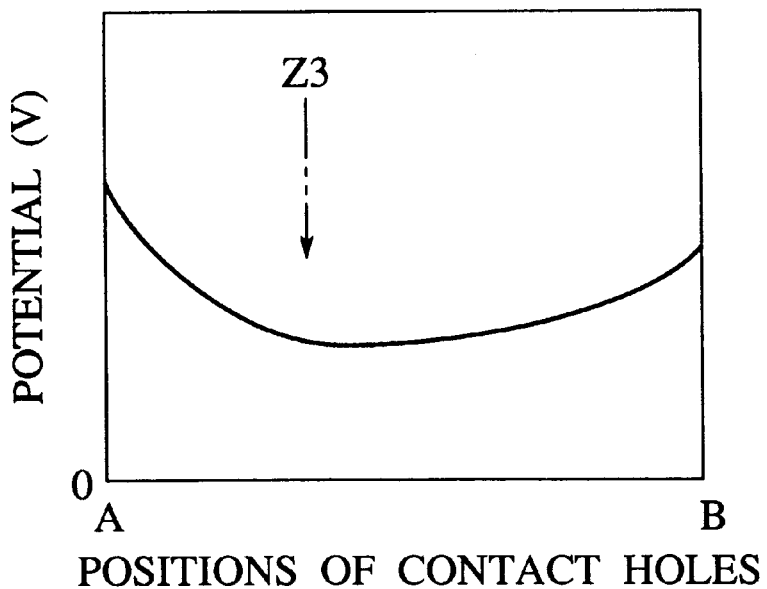
FIGS. 11A and 11B are graphs showing the variation of a potential distribution with the position of contact holes (via holes), or the relationship between the potential distribution and positions where the contact holes are disposed.
Figure 11B:
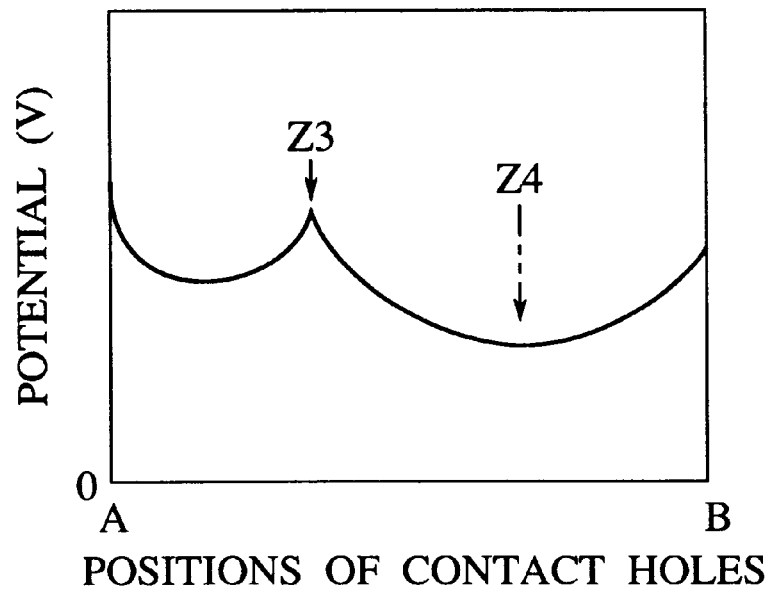

At step S14, the second via hole 312 or the fourth via hole 314 is disposed at the intersection between the third-level higher-potential supplemental power lines 221 and the second-level higher-potential fundamental power lines 212 or at the intersections between the fourth-level higher-potential supplemental power lines 222 and the first-level higher-potential fundamental power supply 211 which are positioned on a cross section passing through the position having the potential minimum in the logic LSI. The "position having the potential minimum" here is worked out by utilizing the information obtained at step S12. Examples of the voltage drop vs. the positions Z3 and Z4 are shown in FIGS. 11A and 11B. FIG. 11A indicates that the present (I'th) "position having the potential minimum" obtained at step S12 is the position Z3. FIG. 11B shows a possible potential distribution when the via holes 314 is disposed at the position Z3, i.e. "position having the potential minimum." As can be seen from the figure, a potential is raised at the position Z3 and lowered at the position Z4.

Then, control returns back to step S12 to verify and compute the circuit, thus obtaining the results of such a drop in potential at the position Z4 as shown in FIG. 11B.

Based on the results, step S13 checks whether the step S13 conditions are satisfied. That is, step S13 decides whether the voltage at the potential minimum drop further as a result of the subsequent (I+1)'th procedure to add one via hole 312 or 314, or decides whether the voltage drop will become larger than the voltage drop in the present (I'th) disposition of the via holes 312 or 314. If any increase of voltage drop the potential minimum is speculated in the subsequent step, step 13 stops the procedure to fix the present (I'th) disposition, not to add the via holes 312 or 314 any more. If the step S13 conditions are not satisfied, control goes to step S14, to continue the procedure. Processing of steps S12 through S14 will be repeated until the step S13 conditions are satisfied.

FIG. 5 shows an example of a pattern of disposing the second via holes 312 and the fourth via holes 314 for power supply lines as completed according to the flowchart of FIG. 8 as mentioned earlier. The corresponding voltage drop is represented by the solid line P11 in the graph of FIG. 8.

As mentioned above, a power-supply line pattern generation method according to the present invention obtains such intersections between the third-level higher-potential supplemental power lines 221 and the second-level higher-potential fundamental power lines 212 or between the fourth-level higher-potential supplemental power lines 222 and the first-level higher-potential fundamental power lines 211 that gives the potential minimum during circuit operations. Then, this method disposes the via holes 312 or 314 starting at those intersections with the potential minimum. If, at the next step, voltage drop at the potential minimum is speculated to become larger, the present method does not dispose the via holes 312 or 314 at those intersections anymore. With this, the present power-supply line pattern generation method can optimize the number and the positions of the via holes 312 and 314, thereby generating such a power-supply line pattern that relaxes voltage drop in fine-patterned, high-integration density LSIs.

Although FIGS. 5, 6A, and 6B show a total of four wiring levels of the first-level higher-potential fundamental power line 211, the second-level higher-potential fundamental power lines 212, the third-level higher-potential supplemental power lines 221, and the fourth-level higher-potential supplemental power lines 222, the first embodiment of the present invention does not always need the quadruple level.

The first embodiment may require only triple level of the first-level higher-potential fundamental power lines 211, the second-level higher-potential fundamental power lines 212, and the third-level higher-potential supplemental power lines 221. In this case, the "second inter-layer insulator film" of the present invention corresponds to the third-level inter-layer insulator film. The first embodiment of the present invention may be also applicable to an LSI having double level of wiring layers comprising only the first-level higher-potential fundamental power lines 211 and the fourth-level higher-potential supplemental power lines 222; double level of wiring layers comprising only the second-level higher-potential fundamental power lines 212 and the third-level higher-potential supplemental power lines 221; or triple level of wiring layers comprising the third-level higher-potential supplemental power lines 221, the fourth-level higher-potential supplemental power lines 222 and either one of the first-level higher-potential fundamental power lines 211 and the second-level higher-potential fundamental power lines 212.

Figure 12:
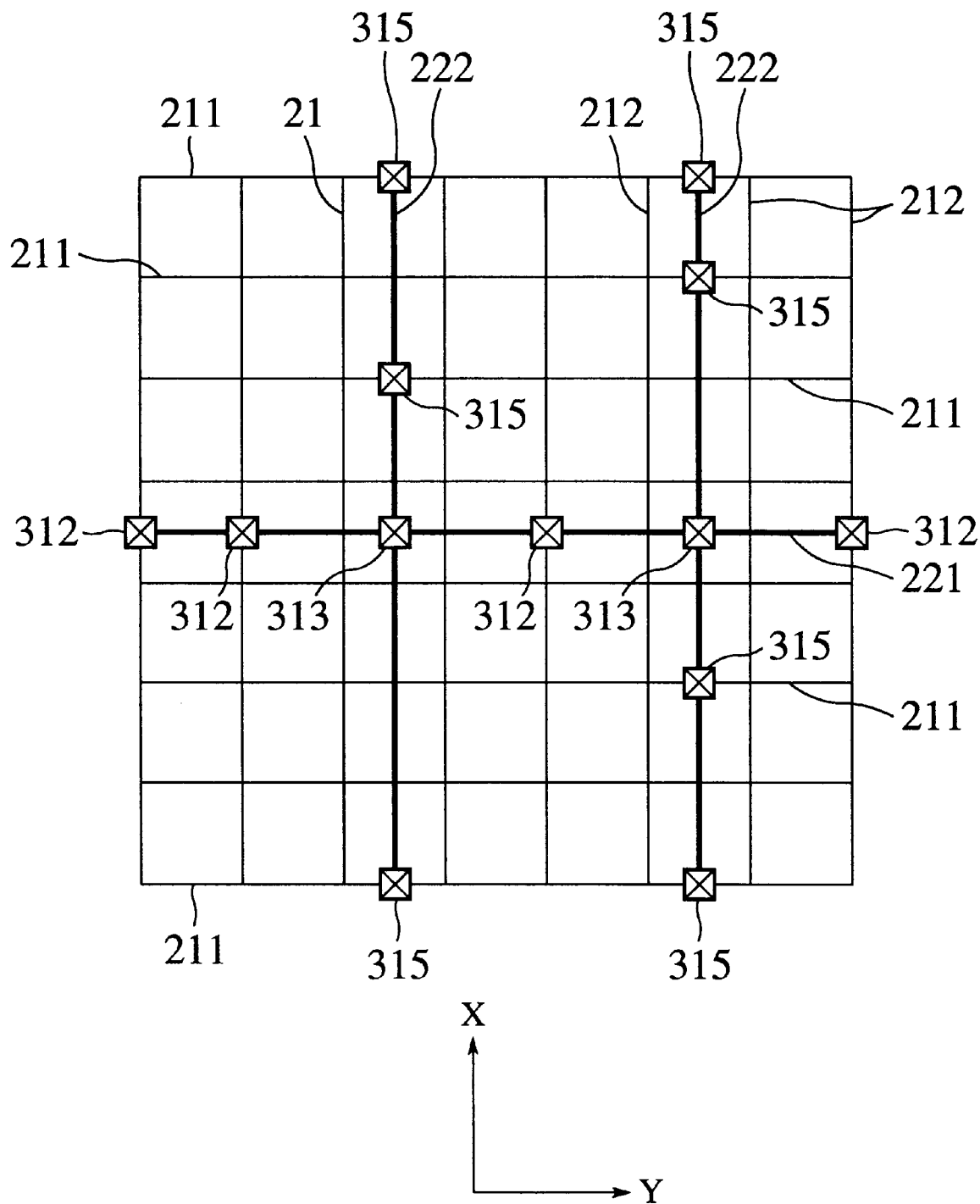
FIG. 12 is a plan view of a pattern for disposing contact holes (via holes) on power supply lines of a logic LSI related to a modification of the first embodiment of the present invention.
Figure 13A:
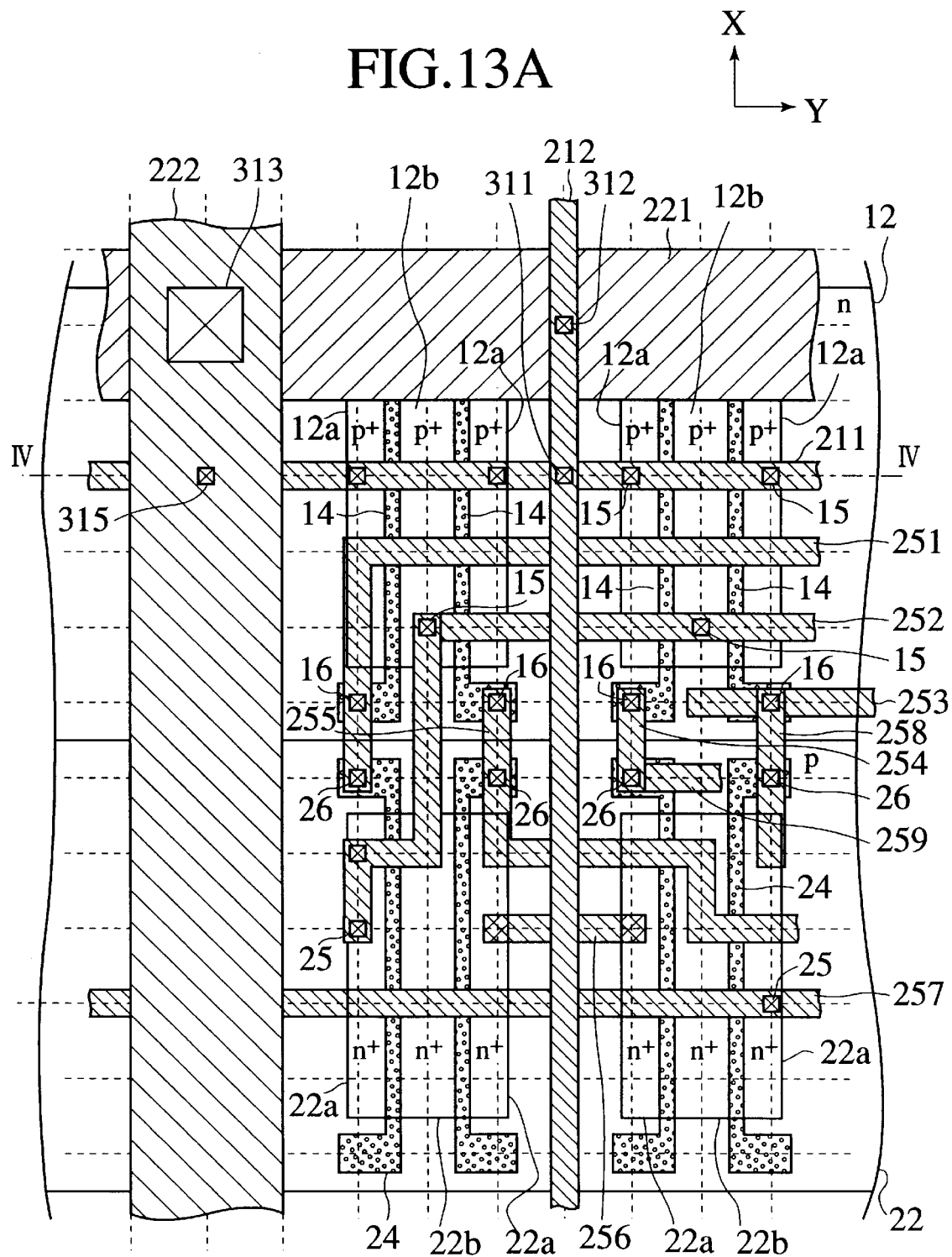
FIG. 13A is a plan view of the detail of part within the logic LSI of the FIG. 12.
Figure 13B:
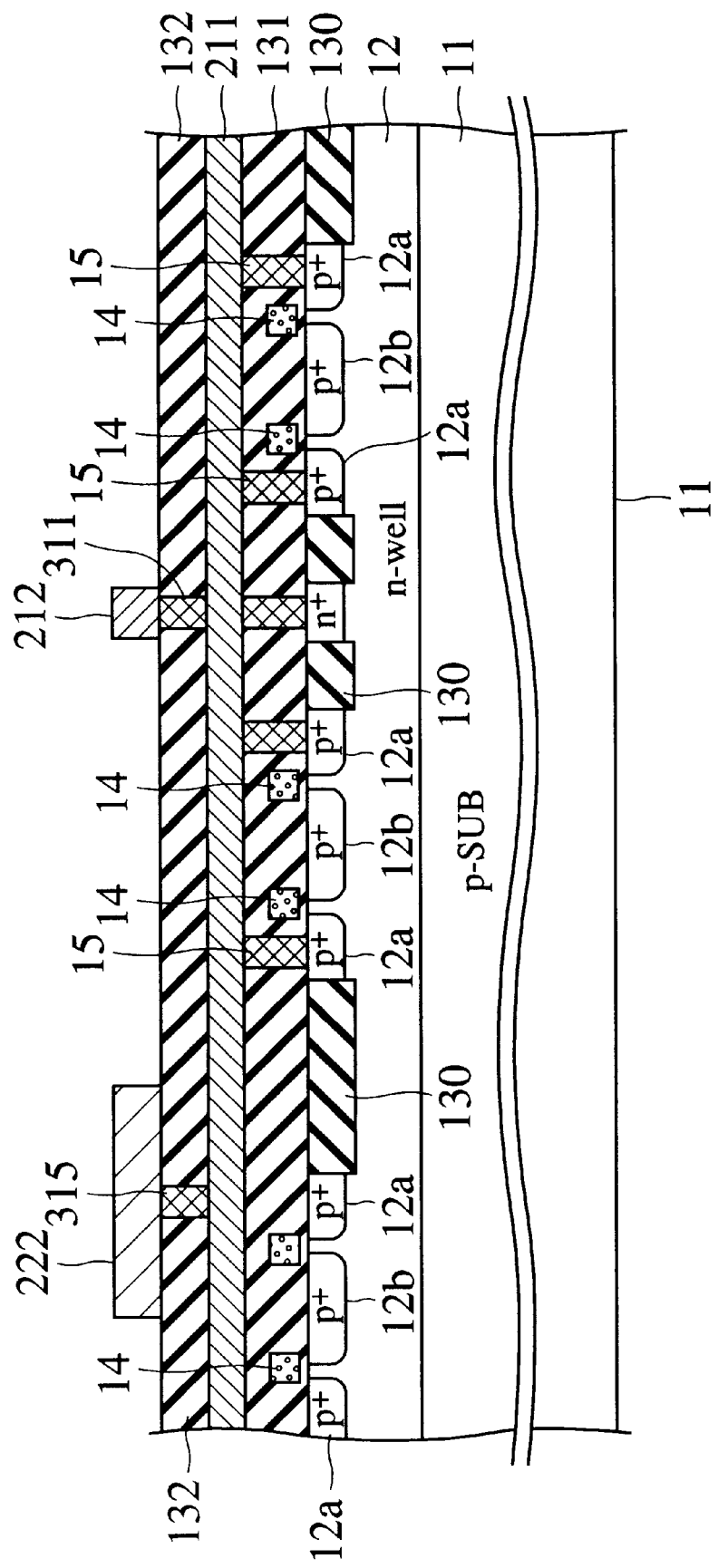
FIG. 13B is a cross-sectional view taken along IV—IV in FIG. 13A.

Also, as shown in FIGS. 12, 13A, and 13B, the first embodiment may use the double level of wiring layers of the first-level higher-potential fundamental power lines 211 and higher-potential supplemental power lines 221 and the second-level higher-potential fundamental power lines 212 and higher-potential supplemental power lines 222. To form the higher-potential fundamental power lines 211 and the higher-potential supplemental power lines 221 in the same level (first level), it is necessary only to form higher-potential supplemental power lines 221 between the higher-potential fundamental power lines 211 as shown in FIG. 12. The "first-level higher-potential supplemental power lines 221" here corresponds to the "third power supply lines" in the case of a double level structure. Also, by forming higher-potential supplemental power lines 222 between the higher-potential fundamental power lines 212, those power supply lines 211 and 221 can be formed on the same level (second level). In this case, the "second-level higher-potential fundamental power lines 212" correspond to the "fourth power supply lines" in the case of the double level structure.

FIG. 13A is a plan view of the details of part of the internal structure of the logic LSI shown in FIG. 12. FIG. 13B is a cross-sectional view taken along IV-IV in FIG. 13A. A CMOS logic circuit shown in FIG. 13A, like that in FIG. 6A, comprises 4-inputs-and-1-output NAND gates realized in basic cells (primitive cells) of gate array. That is, like FIG. 6, the n-well 12 comprises therein $p^+$ source regions 12a, $p^+$ drain regions 12b, an $n^+$ contact region 12c, and gate polysilicon regions 14. The p-well 22, on the other hand, comprises $n^+$ source regions 22a, $n^+$ drain regions 22b, a $p^+$ contact region 22c, and gate polysilicon regions 24. The $p^+$ source region 12a and the $n^+$ contact region 12c are connected via the contact holes 15 to the first-level higher-potential fundamental power lines (VDD) 211. Also, the $n^+$ source region 22a and the $p^+$ contact region 22c are connected through the contact holes 25 to the first-level lower-potential fundamental power lines (VSS) 213. In parallel to the first-level higher-potential fundamental power lines (VDD) 211, the first-level higher-potential supplemental power lines (VDD) 221 are provided. Perpendicular to these first-level higher-potential fundamental power lines (VDD) 211 and the higher-potential supplemental power lines (VDD) 221, the second-level higher-potential fundamental power lines (VDD) 212 and the second-level higher-potential supplemental power lines (VDD) 222 are provided. The line width of the first-level higher-potential supplemental power lines (VDD) 221 and the second-level higher-potential supplemental power lines (VDD) are designed to be equal to or larger than that of the first-level higher-potential fundamental power lines (VDD) 211 or the second-level higher-potential fundamental power lines (VDD) 212.

FIG. 13A shows various signal lines other than these power supply lines 211, 212, 213, 221, and 222. For example, first-level input signal lines 251, 253, 257, and 259 are connected to gate polysilicon regions 14 and 24 via contact holes 16 and 26 respectively, while first-level output signal lines 252 is connected via the contact holes 15 and 25 to the $n^+$ drain region 22$b$ and the $p^+$ drain region 12$b$. Moreover, the gate polysilicon regions 14 and 24 are interconnected with signal lines 254, 255, 258, etc. via the contact holes 16 and 26.

The following will describe the relationship between the first-level higher-potential fundamental power lines (VDD) 211 and the second-level higher-potential fundamental power lines (VDD) 212 and higher-potential supplemental power supply lines (VDD) 222. As shown in FIG. 13B, in a semiconductor integrated circuit (logic LSI) related to a modification of the first embodiment, in and at the upper surface of the p-type semiconductor substrate is formed an n-well region 12, in and at the upper side of which are formed $p^+$ source regions 12$a$, $p^+$ drain regions 12$b$, and $n^+$ contact regions 12$c$ of pMOS transistors of the logic circuit. Those pMOS transistors are isolated from each other by element-isolation regions (STI regions) 130. In the surface of this p-type semiconductor substrate 11, the first-level inter-layer insulator film 131 is provided. Into this first-level inter-layer insulator film 141, gate electrodes (gate polysilicon regions) 14 of each pMOS transistor are formed.

Under the gate electrode (gate polysilicon region)14, there is of course a gate insulator film formed. On the first inter-layer insulator film 131 are provided the first-level higher-potential fundamental power lines (VDD) 211, which interconnect the $p^+$ source regions 12$a$ and the $n^+$ contact regions 12$c$ via the contact holes 15. Although not shown in the cross-sectional view, the first-level higher-potential supplemental power lines (VDD) 221 are of course provided on the first-level inter-layer insulator film 131. The first-level higher-potential fundamental power lines (VDD) 211 are, for example, provided as many as 350 in the Y direction. On the first-level higher-potential fundamental power lines (VDD) 211 and the higher-potential supplemental power lines (VDD) (not shown) 221 is formed a second-level inter-layer insulator film 132, on which are provided the second-level higher-potential fundamental power lines (VDD) 211 and the higher-potential supplemental power lines (VDD) 222. The second-level higher-potential fundamental power lines (VDD) 212 are provided as many as, for example, 86 in the X direction. The second-level higher-potential fundamental power lines (VDD) 212 and the first-level higher-potential fundamental power lines (VDD) 211 are interconnected through the first via holes 311 provided in the second-level inter-layer insulator film 132. Also, the second-level higher-potential supplemental power lines (VDD) 222 and the first-level higher-potential fundamental power lines (VDD) 211 are interconnected through second via holes 315 provided in the second-level inter-layer insulator film 132. The "second via hole 315" here corresponds to the "second contact hole" in the case of the double level structure. As shown in FIG. 13A, the first-level higher-potential supplemental power lines (VDD) 221 and the second-level higher-potential fundamental power lines (VDD) 212 are connected through the third via holes 312. And the fourth via holes 313 are provided in the second level inter-layer insulator film 132 to connect the second-level higher-potential supplemental power lines (VDD) 222 with the first-level higher-potential supplemental power lines (VDD) 221. The "third via hole 312" here corresponds to the "third contact hole" in the case of the double level structure.

It should be noted here that the third via holes 312 are not disposed at every intersection between the first-level higher-potential supplemental power supply lines (VDD) 221 and the second-level higher-potential fundamental power lines (VDD) 212, so that the first-level higher-potential supplemental power lines (VDD) 221 and the second-level higher-potential fundamental power lines (VDD) 212 are not interconnected at the intersections other than particular ones. Likewise, the second via holes 315 are not disposed at every intersection between the second-level higher-potential supplemental power lines (VDD) 222 and the first-level higher-potential fundamental power lines (VDD) 211. The number and the positions of those second and third via holes 315 and 312 are optimized according to the flowchart of FIG. 9. In this case, at step S11, the third via holes 312 are not disposed at any intersections between the first-level higher-potential supplemental power supply lines (VDD) 221 and the second-level higher-potential fundamental power lines (VDD) 212 and, at the same time, the second via holes 315 are not disposed any intersections between the second-level higher-potential supplemental power lines (VDD) 222 and the first-level higher-potential fundamental power lines (VDD) 211, so that processing of steps S12 through S14 may be repeated until it is decided that the S13 conditions are satisfied. In the contact holes 15 and the first through fourth via holes 311, 315, 312, and 313, the first through the fifth plug conductors are embedded, respectively. Those first through fifth plug conductors may come in doped polysilicon, refractory metal, or silicide of the refractory metal.

(SECOND EMBODIMENT)

The following will describe a second embodiment of the present invention. The second embodiment employs another method of disposing contact holes (via holes). The second embodiment of the present invention is carried out according to the flowchart of the FIG. 14.

Figure 15:
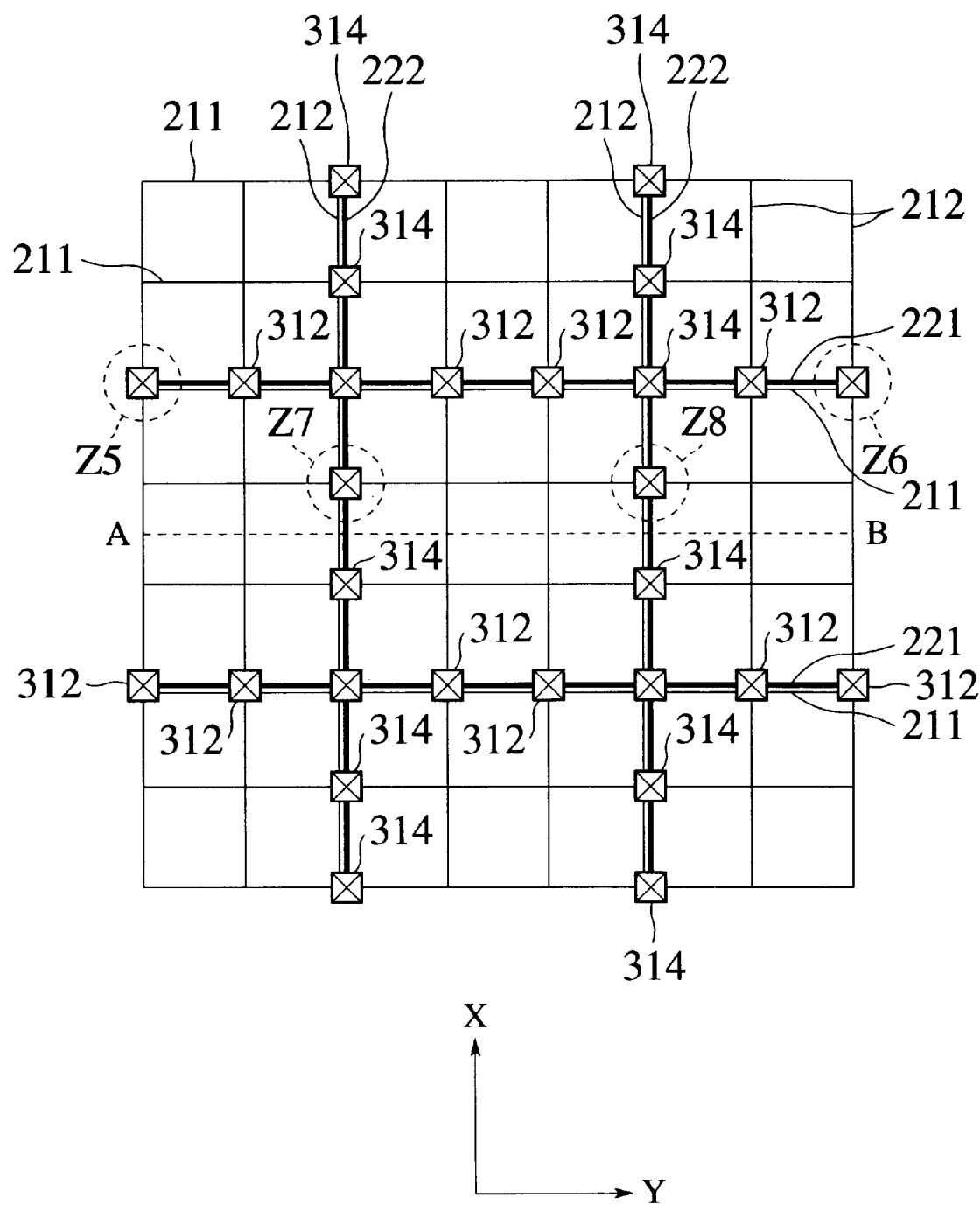
FIG. 15 shows a pattern for disposing contact holes (via holes) at step S21 of FIG. 14.

An example of this carrying out the second embodiment is shown in FIG. 15. FIG. 15 shows the case of quadruple level wiring comprising first-level higher-potential fundamental power lines 211, second-level higher-potential fundamental power lines 212, third-level higher-potential supplemental power supply lines 221, and fourth-level higher-potential supplemental power lines 222.

That is, at step S21 in FIG. 15, the first-level higher-potential fundamental power lines 211, the second-level higher-potential fundamental power lines 212, the third-level higher-potential supplemental power lines 221, and the four th-level higher-potential supplemental power lines 222 are wired throughout the chip. At the same time, contrary to step S11 of the first embodiment, second via holes (third contact holes) 312 and fourth via holes (second contact holes) 314 are disposed at every intersection between the third-level higher-potential supplemental power lines 221 and the second-level higher-potential fundamental power lines 212 and at every intersection between the fourth-level higher-potential supplemental power lines 222 and the first-level higher-potential fundamental power lines 211.

At step S22, like step S12 of FIG. 9, the circuit is verified and computed, to obtain the voltage drop at various positions of the logic LSI.

At step S23 subsequently, it is speculated whether the voltage drop at potential minimum in the logic LSI, when the second via hole 312 or the fourth via hole 314 at a potential maximum is assumed to have been deleted, will become larger than the present (I'th) voltage drop value. At first, the voltage drop at the potential minimum is the largest because the second via holes 312 or the fourth via holes 314 are disposed at every intersection. Therefore, step S23 gives a negation (NO) as a result of decision, so that control goes directly to step S24. That is, the step S23 conditions mean to decide whether the voltage at potential minimum, as a result of the subsequent performance of the (I+1)'th procedure to delete the via hole 312 or 314 at potential maximum by one, will drop further than that of the present (I'th) disposition of the via holes 312 or 314.

Figure 16A:
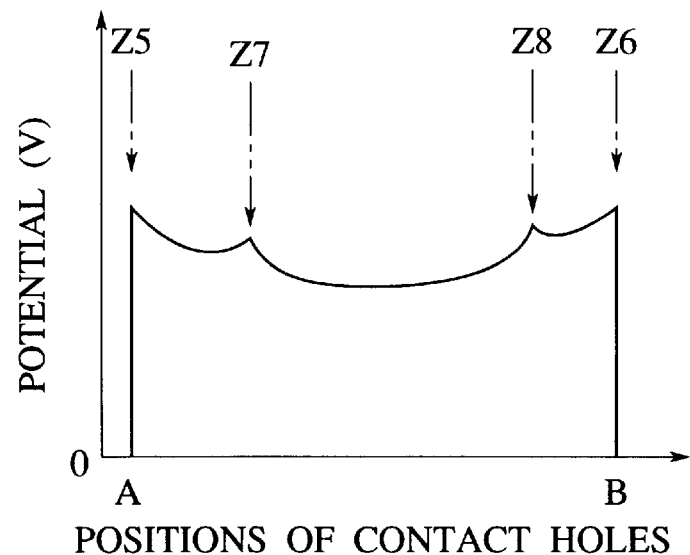
FIGS. 16A through 16C are graphs of changes in potential distribution for each deletion of one contact hole (via hole) according to the flowchart of FIG. 14.
Figure 16B:
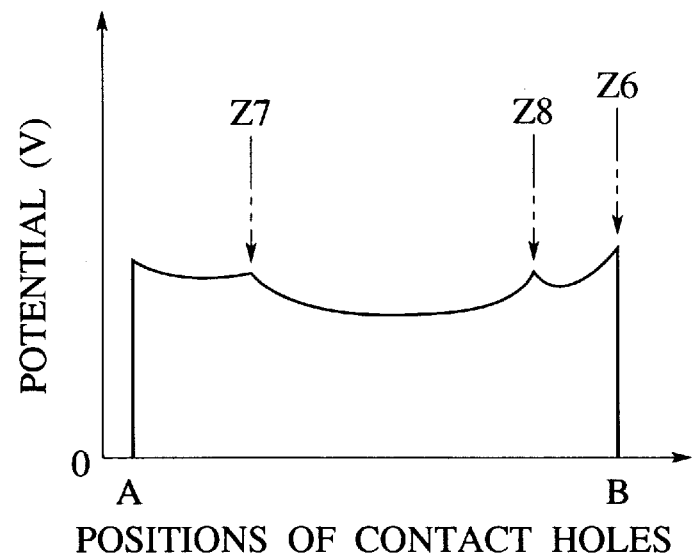
Figure 16C:
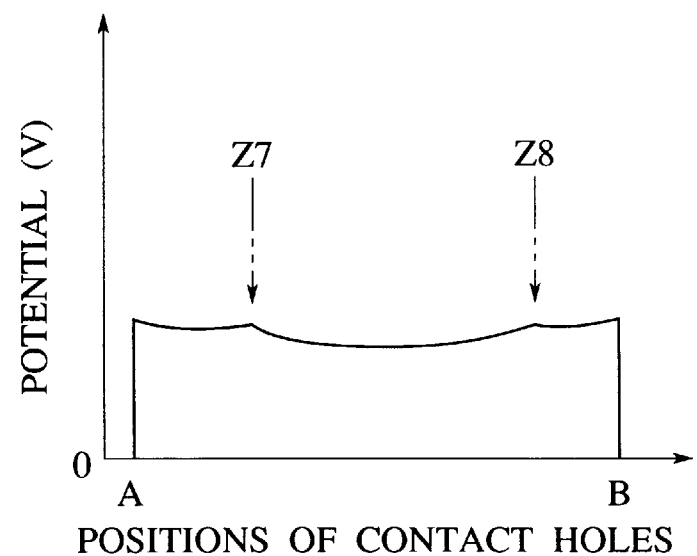

At step S24, the second via hole 312 or the fourth via hole 314 is deleted by one at such intersection that have the potential maximum, out of those intersections between the third-level higher-potential supplemental power lines 221 and the second-level higher-potential fundamental power supply lines 212 or between the fourth-level higher-potential supplemental power lines 222 and the first-level higher-potential fundamental power lines 211. The "intersections that have the potential maximum" have been calculated based on the information obtained at step S22. FIGS. 16A through 16C show the existence/nonexistence of via holes at positions Z5, Z6, Z7, and Z8 shown in FIG. 15 and the changes in potential distribution as a result of deletion of one via hole at the potential maximum. FIG. 16B shows a potential distribution in the case where the via holes 312 at the position Z5 are deleted by one, while FIG. 16C shows a potential distribution in the case where the via holes 312 at the position Z6 are further deleted by one.

At step S22 back, the circuit is verified and computed, to check whether the step S23 conditions are satisfied. That is, at step S23, it is decided whether the voltage drop at potential minimum, as a result of the subsequent performing of the (I+1)'th procedure to delete the via hole 312 or 314 by one, will become larger than that of the present (I'th) disposition of the via holes 312 or 314. If any increase in the subsequent step is speculated, the processing stops the procedure to fix the present (I'th) disposition, not to delete the via hole 312 or 314 any more. If the step S23 conditions are not satisfied, control goes to step S24, to continue the procedure. Processing of steps S22 through S24 is repeated until the step S23 conditions are satisfied.

Figure 14:
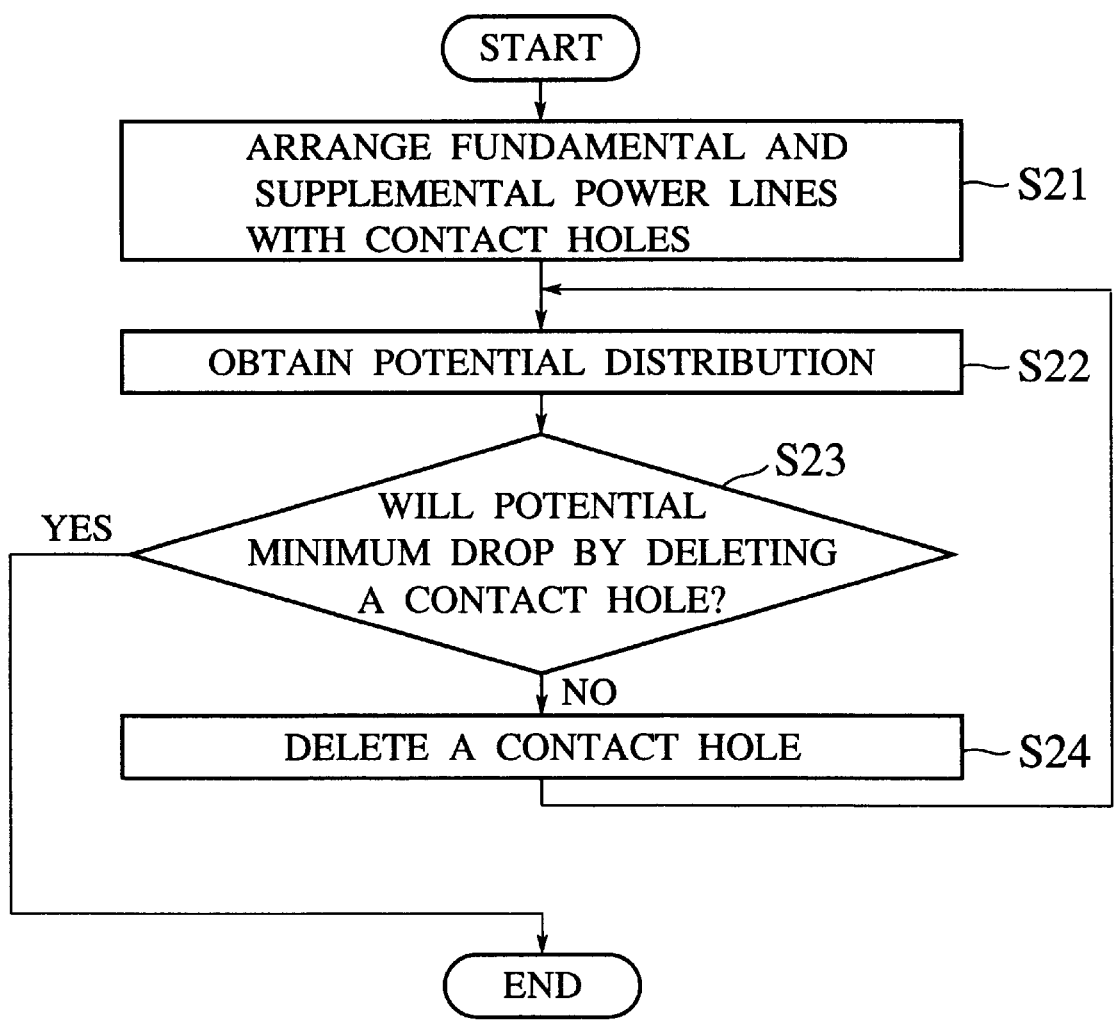
FIG. 14 is a flowchart of a power supply line pattern generation method related to a second embodiment of the present invention.

A graph of potential distribution completed according to the flowchart of FIG. 14 is represented by the solid line P11 of FIG. 8 described about the first embodiment.

As mentioned above, according to a power supply line pattern generation method of the second embodiment, the second via holes 312 and the fourth via holes 314 are disposed at every intersection between the third-level higher-potential supplemental power lines 221 and the second-level higher-potential fundamental power lines 212 and between the fourth-level higher-potential supplemental power lines 222 and the first-level higher-potential fundamental power lines 211. Then, before deleting one of those via holes at the next step, a specified position of via hole 312 or 314 where the voltage drop value at potential minimum will become smaller is speculated to sequentially delete only the corresponding via hole 312 or 314 at the specified position. Thus, it is possible to optimize the number and the positions of the via holes 312 or 314 in power supply lines, thereby realizing such power supply lines that will relax voltage drop. Also, the larger the number of blocks that give rise to a large operation current in the logic circuit, the more number of vi holes 312 or 314 will be required. Therefore, when there are rather many of such current dissipating blocks, the method of the second embodiment will realize faster optimization than the above-mentioned first embodiment.

Although FIG. 15 shows the quadruple level wiring comprising the first-level higher-potential fundamental power lines 211, the second-level higher-potential fundamental power lines 212, the third-level higher-potential supplemental power lines 221, and the fourth-level higher-potential supplemental power lines 222, the second embodiment of the present invention does not always require the quadruple level. The second embodiment may be applicable to triple level structure comprising the first-level higher-potential fundamental power lines 211, the second-level higher-potential fundamental power lines 212, and the third-level higher-potential supplemental power lines 221. Also, the second embodiment may require only double level comprising the first-level higher-potential fundamental power lines 211 and the fourth-level higher-potential supplemental power lines 222 or triple level structure comprising the third-level higher-potential supplemental power lines 221, the fourth-level higher-potential supplemental power lines 222 and either one of the first-level higher-potential fundamental power lines 211 and the second-level higher-potential fundamental power lines 212.

Figure 17:
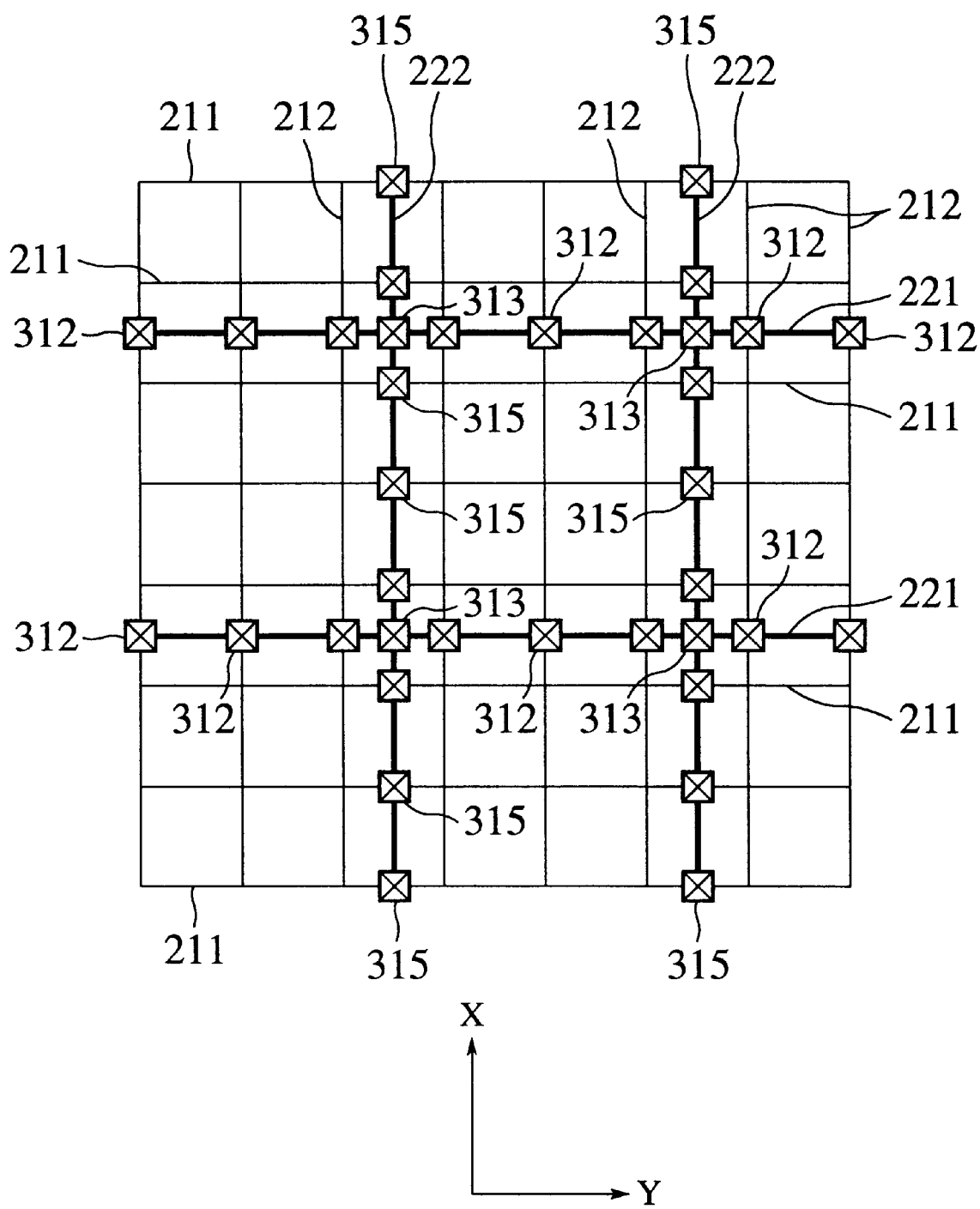
FIG. 17 is a plan view of a pattern for disposing contact holes (via holes) for power supply lines of a logic LSI related to a modification of the second embodiment of the present invention.

The second embodiment may, as shown in FIG. 17, modify to double level structure comprising the first-level higher-potential fundamental power lines 211 and higher-potential supplemental power lines 221 and the second-level higher-potential fundamental power lines 212 and higher-potential supplemental power lines 222. To form the higher-potential fundamental power lines 211 and the higher-potential supplemental power lines 221 in the same level (the first level), the higher-potential supplemental power lines 221 only have to be formed between the higher-potential fundamental power lines 211 as shown in FIG. 17. Or the higher-potential supplemental power lines 222 can be formed between the higher-potential fundamental power lines 212, thus forming these power supply lines in the same level (the second level). FIG. 17 shows a case where, in parallel to the first-level higher-potential fundamental power lines (VDD) 211, the first-level higher-potential supplemental power lines (VDD) 221 are provided and, at the same time, perpendicular to the first-level higher-potential fundamental power lines (VDD) 211 and the higher-potential supplemental power lines (VDD) 221 are provided the second-level higher-potential fundamental power lines (VDD) 212 and the second-level higher-potential supplemental power lines (VDD) 222. That is, on the first-level inter-layer insulator film, in which MOSFET gate electrodes (gate polysilicon) are formed, are provided the first-level higher-potential fundamental power lines (VDD) 211 and the first-level higher-potential supplemental power lines (VDD) 221, on both of which is provided the second-level inter-layer insulator film 132, on which are provided the second-level higher-potential fundamental power lines (VDD) 211 and the higher-potential supplemental power lines (VDD) 222. The second-level higher-potential fundamental power lines (VDD) 212 and the first-level higher-potential fundamental power lines (VDD) 211 are interconnected through the first via holes 311 provided in the second-level inter-layer insulator film 132. Also, the second-level higher-potential supplemental power lines (VDD) 222 and the first-level higher-potential fundamental power lines (VDD) 211 are interconnected through the second via holes 315 provided in the second-level inter-layer insulator film 132. Moreover, the first-level higher-potential supplemental power lines (VDD) 221 are connected to the second-level higher-potential fundamental power lines (VDD) 212 and the second-level higher-potential supplemental power lines (VDD) 222 through the third via holes 312 and the fourth via holes 313 provided in the second-level inter-layer insulator film 132, respectively.

It should be noted here that the third via holes 312 are not disposed at every intersection between the first-level higher-potential supplemental power lines (VDD) 221 and the second-level higher-potential fundamental power supply lines (VDD) 212 but only at those intersections other than particular ones. Likewise, the second via holes 315 are not disposed at every intersection between the second-level higher-potential supplemental power lines (VDD) 222 and the first-level higher-potential fundamental power lines (VDD) 211. The number and the positions of these second and third via holes 315 and 312 are optimized according to the flowchart of FIG. 14. In this case, it is necessary, at step S21, only to dispose second via holes 315 at every intersection between the first-level higher-potential fundamental power lines (VDD) 211 and the second-level higher-potential supplemental power lines (VDD) 222 and to dispose the third via holes 312 at every intersection between the first-level higher-potential supplemental power lines (VDD) 221 and the second-level higher-potential fundamental power lines (VDD) 212, and then repeat processing of steps S22 through S24 until the step 23 conditions are decided to be satisfied.

(SOFTWARE AND HARDWARE TOOLS)

Figure 18A:
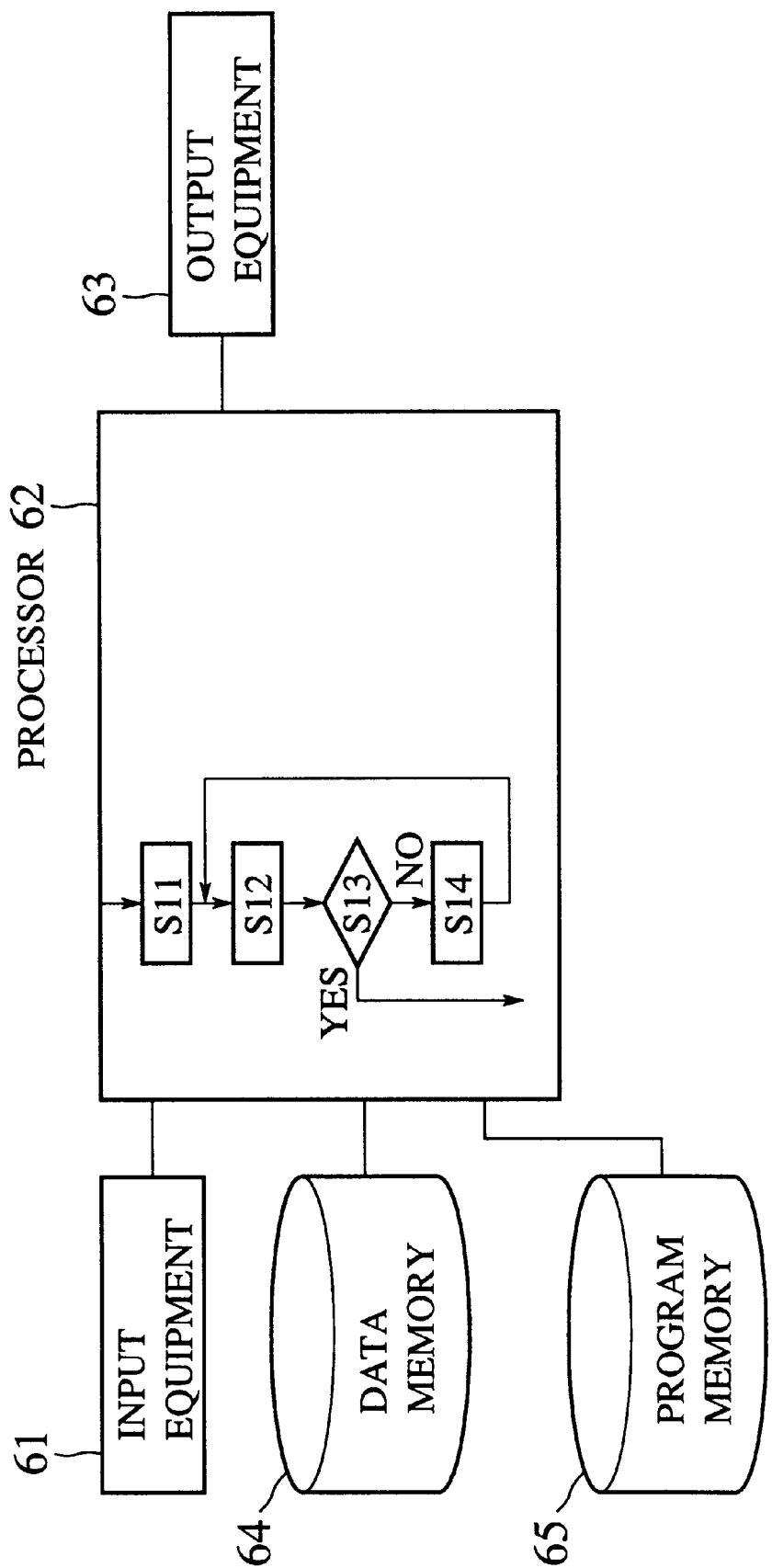
FIG. 18A is a block diagram of a system configuration employed when performing the design method of the first embodiment of the present invention.
Figure 18C:
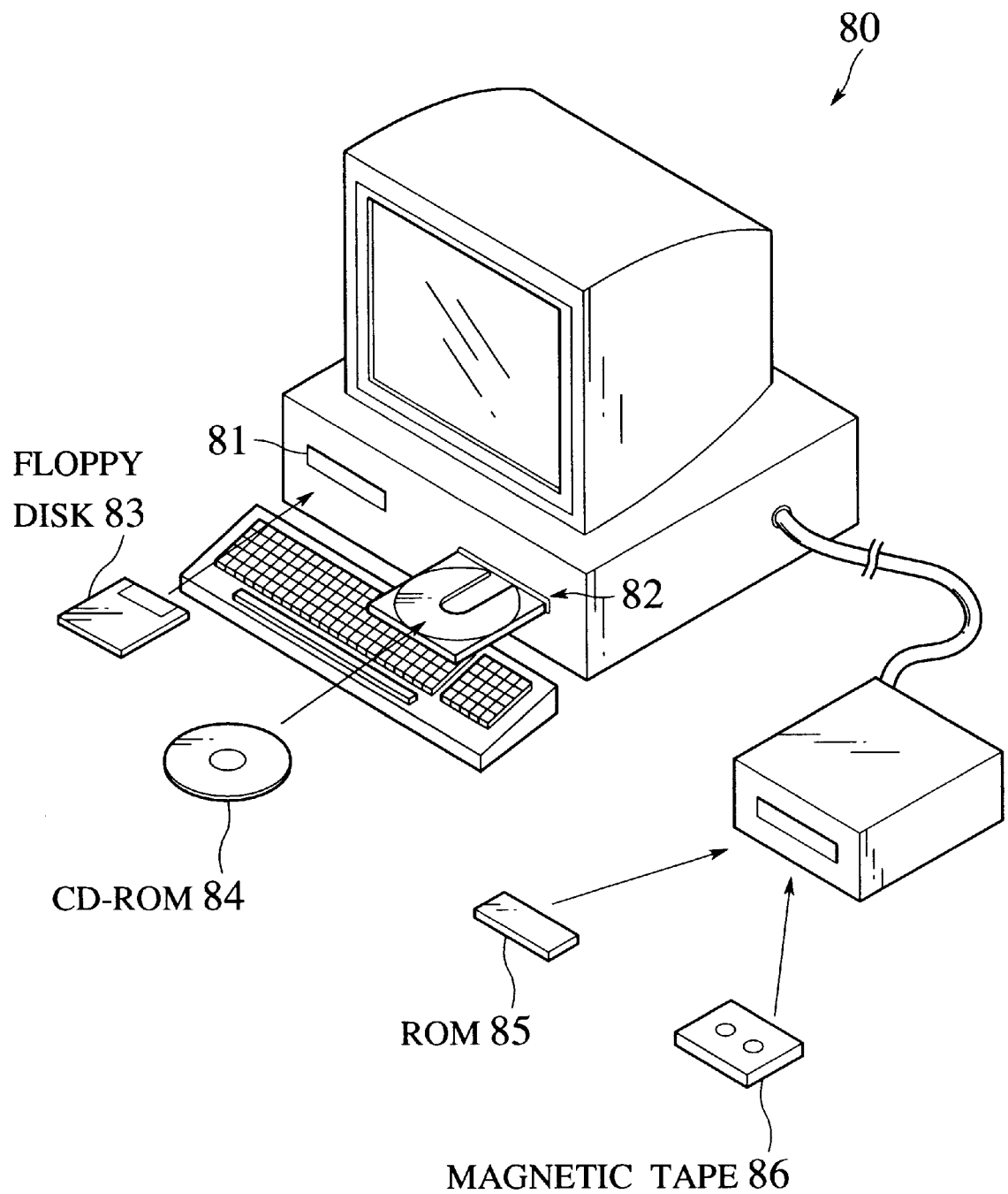
FIG. 18C is a bird's eye view showing an outline of an LSI design system of the present invention.

To actually layout a power supply line pattern for logic LSIs according to the present invention, it is necessary only to store a program to perform the design method according to the flowchart shown in FIG. 9 or 14 into a memory or a program storage device and then allow a hardware tool comprising a computer etc. shown in FIGS. 18A through 18C to read out thus stored program.

As shown in FIGS. 18A and 18B, design systems or pattern layout tools according to the present invention comprises at least: an input equipment 61 which receives as input the data and commands from the operator; a processor 62 provided with a functional means for determining various disposition and layouts for a series of power supply lines, via holes connecting those power supply lines, and contact holes directly connected to the logic circuit; an output equipment 63 which outputs the disposition and patterns generated as the results; a data memory 64 which stores data necessary to decide disposition and layouts of patterns for wiring and contact holes (via holes); and a program memory 64 which stores programs for causing the processor 62 to decide disposition patterns for contact holes (via holes) such as described about the first or second embodiment. The input equipment 61 comprises a keyboard, a mouse, a light pen, and a floppy disk unit. The processor 62, the data memory 64, and the program memory 65 comprises a CPU, ROMS and RAMS, magnetic disks, and other memories connected to the CPU in an ordinary computer system. The output equipment 63 comprises a display, a printer, etc. Also, the output equipment 63 may be connected to a mask pattern exposure system or photo repeater, to create reticules or other photo masks or may be connected to a direct stepping on wafer (DSW) type mask aligner, to directly write LSI patterns on wafers. In a pattern layout tool according to the present invention, input data for processing performed by the processor 62 is stored in the data memory 64 and program instructions, on the other hand, are stored in the program memory 65, both of which are read as required into the CPU for arithmetic operations, so that numeral information and other data generated for each step of those arithmetic operations are stored in the RAMs or magnetic disks.

According to the thirds embodiment of the present invention, the program to be executed by the pattern layout tool for deciding the layouts of the contact holes (via holes) described about the first and second embodiments is saved in memories or in computer usable media whose contents can be read out by the computer. The contents saved in these memories or computer usable media are read out by such a computer system as shown in FIGS. A and B, to be stored in the program memory 65. The program is then executed by the processor 62, to decide disposition and layout of patterns for power supply lines etc. of semiconductor integrated circuits. Memories here include magnetic disks, optical disks, magneto-optical disks, magnetic tapes, and other media which can store necessary programs. External memories of the computer are also included in those memories. Thus, the processor 62 can carry out the pattern layout design methods of the power supply lines and contact holes described in the first and second embodiments. FIG. 18A shows a configuration by which programs according to the flowchart of FIG. 9 are stored in a memory and then executed by the processor 62, while FIG. 18B shows a configuration by which programs according to the flowchart of FIG. 14 are stored in a memory and then executed by the processor 62.

FIG. 18C is a bird's eye view of the outline of a design system for LSI patterns. The design system 80 comprises a floppy disk unit (floppy disk drive) 81 and an optical disk unit (optical disk drive) 82. To the floppy disk drive 81 and the optical disk drive 82, a floppy disk 83 and a CD-ROM 84 can be inserted at their respective slots, to perform prescribed read-out processing. With this, the programs in these memories can be installed into the system, to generate and layout power supply line patterns and contact holes for semiconductor integrated circuits by use of methods described about the first and second embodiments. Also, by connecting prescribed drives to the body, memories such as ROMs 85 employed in for example game packs or cassette tapes 86 as magnetic tapes can be used. The output equipment of this design system 80 may be connected to a pattern exposure system such as a pattern generator, a photo repeater, a DSW type mask aligner, and other pattern lithography systems.

Various modifications will become possible for those skilled in the art after receiving the teachings of the present invention without departing from the scope of thereof.

What is claimed is:

1. A semiconductor integrated circuit comprising:

a semiconductor chip:

a logic circuit which performs prescribed logical operations, the logic circuit disposed at a center of and on said semiconductor chip;

a power supply ring disposed at a periphery of said semiconductor chip;

a first inter-layer insulator film provided on said logic circuit;

first power supply lines connected to said power supply ring, periodically provided on said first inter-layer insulator film with a constant pitch;

first plug conductors connected between said logic circuit and said first power supply lines through first contact holes provided in said first inter-layer insulator film;

a second inter-layer insulator film provided above said first power supply lines;

second power supply lines connected to said power supply ring, periodically provided on said second inter-layer insulator film with a constant pitch, the second power supply lines crossing over said first power supply lines so as to define intersections with said first power supply lines, the intersections being arranged uniformly on the logic circuit; and second plug conductors connected between said first and second power supply lines through second contact holes provided in said second inter-layer insulator film, the second plug conductors are not disposed at all of said intersections so that the number and the positions of the second plug conductors are determined so as to raise a minimum value of a potential profile curve defined by voltage drops at the intersections from the voltage at said power supply ring.

2. The circuit of claim 1, wherein said second power supply lines are supplemental power lines which electrically supplement said first power supply lines.

3. The circuit of claim 1, wherein the wiring width of said second power supply lines is equal to or larger than that of said first power supply lines.

4. The circuit of claim 1, wherein said second power supply lines are perpendicular to said first power supply lines.

5. The circuit of claim 1, wherein said first inter-layer insulator film is a first-level inter-layer insulator film and said second inter-layer insulator film is a second-level inter-layer insulator film.

6. The circuit of claim 5, further comprising:

third power supply lines connected to said power supply ring, which are provided, on said first inter-layer insulator film, in parallel to said first power supply lines and also which have a wiring width equal to or larger than that of said first power supply lines; and fourth power supply lines connected to said power supply ring, which are provided, on said second inter-layer insulator film, in parallel to said second power supply lines.

7. The circuit of claim 6, further comprising third plug conductors connected between said first third and fourth power supply lines through third contact holes, the third plug conductors are not disposed at all of said intersections between said third and fourth power supply lines so that number and positions of the third plug conductors are determined so as to raise the minimum value of said potential profile curve, the third contact holes are formed through said second inter-layer insulator film.

8. The circuit of claim 1, further comprising a second-level inter-layer insulator film provided on said first power supply lines, wherein said first inter-layer insulator film is a first-level inter-layer insulator film and said second inter-layer insulator film is a third-level inter-layer insulator film.

9. The circuit of claim 8, further comprising:

third power supply lines connected to said power supply ring, periodically provided on said second-level inter-layer insulator film with a constant pitch, the third power supply lines crossing over said first power supply lines so as to define intersections arranged uniformly on the logic circuit.

10. The circuit of claim 1, further comprising:

a second-level inter-layer insulator film provided on said first power supply lines; and a third-level inter-layer insulator film provided above said second-level inter-layer insulator film, wherein said first inter-layer insulator film is a first-level inter-layer insulator film and said second inter-layer insulator film is a fourth-level inter-layer insulator film.

11. The circuit of claim 10, further comprising:

third power supply lines connected to said power supply ring, periodically provided on said second-level inter-layer insulator film with a constant pitch, the third power supply lines crossing over said first power supply lines so as to define intersections arranged uniformly on the logic circuit;

fourth power supply lines connected to said power supply ring, periodically provided on said third-level inter-layer insulator film with a constant pitch, the fourth power supply lines crossing over said third power supply lines so as to define intersections arranged uniformly on the logic circuit.

12. The circuit of claim 11, wherein the wiring width of said fourth power supply lines is equal to or larger than that of said first power supply lines.

13. The circuit of claim 11, further comprising third plug conductors connected between said third and fourth power supply lines through third contact holes, the second plug conductors are not disposed at all of said intersections between said third and fourth power supply lines so that number and positions of the third plug conductors are determined so as to raise the minimum value of said potential profile curve, the third contact holes are formed through said third-level inter-layer insulator film.

14. A design method for layouting patterns of a semiconductor integrated circuit on a semiconductor chip, comprising the steps of:

(a) a first step of disposing periodically first power supply lines on a first inter-layer insulator film and disposing periodically second power supply lines on a second inter-layer insulator film, the second power supply lines crossing over said first power supply lines so as to define intersections with said first power supply lines, the intersections being arranged uniformly;

(b) a second step of obtaining, after said first step, voltage drops at said intersections from the voltage at a periphery of said semiconductor chip;

(c) a third step of adding one contact hole to one of said intersections disposed at a position having a minimum value of a potential profile curve defined by said voltage drops, wherein executions of said second step and said third step are sequentially repeated until said minimum value is speculated to become larger than a present value as a result of the subsequent execution of said third step so that said contact holes are not disposed at all of said intersections.

15. The method of claim 14, wherein said first power supply lines are directly connected to the logic circuit, while said second power supply lines are supplemental power lines to electrically supplement said first power supply lines.

16. A design method for layouting patterns of a semiconductor integrated circuit on a semiconductor chip, comprising the steps of:

(a) a first step of disposing periodically first power supply lines on a first inter-layer insulator film and disposing periodically second power supply lines in a second inter-layer insulator film, the second power supply lines crossing over said first power supply lines so as to define intersections with said first power supply lines, the intersections being arranged and, disposing contact holes at all of said intersections;

(b) a second step of obtaining, after said first step, voltage drops at said intersections from the voltage at a periphery of said semiconductor chip;

(c) a third step of deleting one of said contact holes from one of said intersections disposed at a position having a maximum value of a potential profile curve defined by said voltage drops; and wherein executions of said second step and said third step are repeated until a minimum value of said potential profile curve is speculated to become larger than the present value as a result of the subsequent execution of said third step so that said contact holes are not disposed at all of said intersections.

17. The method of claim 16, wherein said second power supply lines are supplemental power lines which electrically supplement said first power supply lines.

18. A memory storing a program being executed on a design system of a semiconductor integrated circuit on a semiconductor chip, the program comprising the steps of:

(a) a first step of disposing periodically first power supply lines on a first inter-layer insulator film and disposing periodically second power supply lines on a second inter-layer insulator film, the second power supply lines crossing over said first power supply lines so as to define intersections with said first power supply lines;

(b) a second step of obtaining, after said first step, voltage drops at said intersections from the voltage at a periphery of said semiconductor chip;

(c) a third step of adding one contact hole to one of said intersections disposed at a position having a minimum value of a potential profile curve defined by said voltage drops, wherein executions of said second step and said third step are repeated until said minimum value is speculated to become larger than a present value as a result of the subsequent execution of said third step so that said contact holes are not disposed at all of said intersections.

19. A memory storing a program being executed on a design system of a semiconductor integrated circuit on a semiconductor chip, the program comprising the steps of:

(a) a first step of disposing periodically first power supply lines on a first inter-layer insulator film and disposing periodically second power supply lines in a second inter-layer insulator film, the second power supply lines crossing over said first power supply lines so as to define intersections with said first power supply lines, the intersections being arranged and, disposing contact holes at all of said intersections;

(b) a second step of obtaining, after said first step, voltage drops at said intersections from the voltage at a periphery of said semiconductor chip;

(c) a third step of deleting one of said contact holes from one of said intersections disposed at a position having a maximum value of a potential profile curve defined by said voltage drops, wherein executions of said second step and said third step are repeated until a minimum value of said potential profile curve is speculated to become larger than the present value as a result of the subsequent execution of said third step so that said contact holes are not disposed at all of said intersections.

* * * * *